US011561260B2

(12) United States Patent
Goto et al.

(10) Patent No.: US 11,561,260 B2
(45) Date of Patent: Jan. 24, 2023

(54) USED SECONDARY BATTERY MODULE MANAGEMENT SYSTEM SERVER, USED SECONDARY BATTERY MODULE MANAGEMENT SYSTEM EXTERNAL TERMINAL, AND USED SECONDARY BATTERY MODULE MANAGEMENT SYSTEM

(71) Applicant: DENSO CORPORATION, Kariya (JP)

(72) Inventors: Keisuke Goto, Kariya (JP); Haruki Tanaka, Kariya (JP); Mayu Iida, Kariya (JP); Hiroyasu Suzuki, Kariya (JP); Nobuo Yamamoto, Kariya (JP); Shogo Suzuki, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/577,058

(22) Filed: Jan. 17, 2022

(65) Prior Publication Data

US 2022/0229120 A1 Jul. 21, 2022

(30) Foreign Application Priority Data

Jan. 19, 2021 (JP) .............................. JP2021-006532
Sep. 1, 2021 (JP) .............................. JP2021-142270

(51) Int. Cl.
*G01R 31/392* (2019.01)
*G01R 31/396* (2019.01)
*G01R 31/378* (2019.01)

(52) U.S. Cl.
CPC ......... *G01R 31/392* (2019.01); *G01R 31/378* (2019.01); *G01R 31/396* (2019.01)

(58) Field of Classification Search
CPC .. G01R 31/392; G01R 31/378; G01R 31/396; Y02E 60/10; Y02W 30/84; G06Q 10/30; H01M 10/4285; H01M 10/04
See application file for complete search history.

(56) References Cited

U.S. PATENT DOCUMENTS

2007/0108946 A1* 5/2007 Yamauchi ............. H01M 10/42
320/132
2010/0188039 A1 7/2010 Yamauchi et al.
2013/0018610 A1 1/2013 Yamauchi et al.

FOREIGN PATENT DOCUMENTS

JP 2010-172122 A 8/2010
JP 2011-146389 A 7/2011
(Continued)

*Primary Examiner* — Xiao En Mo
(74) *Attorney, Agent, or Firm* — Harness, Dickey & Pierce, P.L.C.

(57) ABSTRACT

A used secondary battery module management system server manages a manufacture of a battery assembly. The server stores, in a memory, a correspondence relationship of each of secondary battery modules among identification information, ranks, and status information. The server extracts an available rank from the ranks in response to a rebuilding request for the battery assembly. The available rank is a rank in which the number of the secondary battery modules having the status information indicating that the secondary battery modules are available is equal to or larger than the number of the secondary battery modules required to constitute the battery assembly. The server receives, from an external terminal, the identification information on each of selection secondary battery modules having an identical rank.

19 Claims, 11 Drawing Sheets

(56) References Cited

FOREIGN PATENT DOCUMENTS

| JP | 2014-011060 A | 1/2014 |
|---|---|---|
| WO | WO-2018104965 A1 | 6/2018 |

\* cited by examiner

FIG. 3

| RANK (Rn) | IDENTIFICATION INFORMATION (Mn) | STATUS INFORMATION (St) BEFORE UPDATE | STATUS INFORMATION (St) AFTER UPDATE | AVAILABLE NUMBER (An) BEFORE UPDATE | AVAILABLE NUMBER (An) AFTER UPDATE | DIAGNOSIS DATE AND TIME | SPECIFIC DIAGNOSIS DATE AND TIME |
|---|---|---|---|---|---|---|---|
| R1 | M101 | AVAILABLE | TENTATIVELY RESERVED | 10 | 5 | yymmdd (1-1) | yymmdd (1-1) |
| | M102 | AVAILABLE | TENTATIVELY RESERVED | | | yymmdd (1-2) | |
| | M103 | AVAILABLE | TENTATIVELY RESERVED | | | yymmdd (1-3) | |
| | M104 | AVAILABLE | TENTATIVELY RESERVED | | | yymmdd (1-4) | |
| | M105 | AVAILABLE | TENTATIVELY RESERVED | | | yymmdd (1-5) | |
| | M106 | AVAILABLE | (SAME AS BEFORE UPDATE) | | | yymmdd (1-6) | |
| | ... | ... | ... | | | ... | |
| | M110 | AVAILABLE | (SAME AS BEFORE UPDATE) | | | yymmdd (1-10) | |
| R2 | M201 | AVAILABLE | (SAME AS BEFORE UPDATE) | 8 | (SAME AS BEFORE UPDATE) | yymmdd (2-1) | yymmdd (2-1) |
| | ... | ... | ... | | | ... | |
| | M208 | AVAILABLE | (SAME AS BEFORE UPDATE) | | | yymmdd (2-8) | |
| R3 | M301 | AVAILABLE | (SAME AS BEFORE UPDATE) | 12 | (SAME AS BEFORE UPDATE) | yymmdd (3-1) | yymmdd (3-1) |
| | ... | ... | ... | | | ... | |
| | M312 | AVAILABLE | (SAME AS BEFORE UPDATE) | | | yymmdd (3-12) | |
| R4 | M401 | AVAILABLE | (SAME AS BEFORE UPDATE) | 20 | (SAME AS BEFORE UPDATE) | yymmdd (4-1) | yymmdd (4-1) |
| | ... | ... | ... | | | ... | |
| | M420 | AVAILABLE | (SAME AS BEFORE UPDATE) | | | yymmdd (4-20) | |
| R5 | M501 | AVAILABLE | (SAME AS BEFORE UPDATE) | 4 | (SAME AS BEFORE UPDATE) | yymmdd (5-1) | yymmdd (5-1) |
| | ... | ... | ... | | | ... | |
| | M504 | AVAILABLE | (SAME AS BEFORE UPDATE) | | | yymmdd (5-4) | |
| R6 | M601 | AVAILABLE | (SAME AS BEFORE UPDATE) | 2 | (SAME AS BEFORE UPDATE) | yymmdd (6-1) | yymmdd (6-1) |
| | M602 | AVAILABLE | (SAME AS BEFORE UPDATE) | | | yymmdd (6-2) | |
| ... | ... | ... | ... | ... | ... | ... | ... |
| Rw | Mw1 | ASSEMBLED | (SAME AS BEFORE UPDATE) | 3 | (SAME AS BEFORE UPDATE) | yymmdd (w-1) | yymmdd (w-1) |
| | ... | ... | ... | | | ... | |
| | Mw10 | ASSEMBLED | (SAME AS BEFORE UPDATE) | | | yymmdd (w-10) | |
| | Mw11 | AVAILABLE | (SAME AS BEFORE UPDATE) | | | yymmdd (w-11) | |
| | Mw12 | AVAILABLE | (SAME AS BEFORE UPDATE) | | | yymmdd (w-12) | |
| | Mw13 | AVAILABLE | (SAME AS BEFORE UPDATE) | | | yymmdd (w-13) | |
| Rx | Mx1 | AVAILABLE | (SAME AS BEFORE UPDATE) | 2 | (SAME AS BEFORE UPDATE) | yymmdd (x-1) | yymmdd (x-1) |
| | Mx2 | AVAILABLE | (SAME AS BEFORE UPDATE) | | (SAME AS BEFORE UPDATE) | yymmdd (x-2) | |
| Ry | My1 | ASSEMBLED | (SAME AS BEFORE UPDATE) | 0 | (SAME AS BEFORE UPDATE) | yymmdd (y-1) | |
| | ... | ... | ... | | | ... | |
| | My10 | ASSEMBLED | (SAME AS BEFORE UPDATE) | | | yymmdd (y-3) | |

Rs: R1

Ra: R1–R4

USED SECONDARY BATTERY MODULE MANAGEMENT SYSTEM SERVER, USED SECONDARY BATTERY MODULE MANAGEMENT SYSTEM EXTERNAL TERMINAL, AND USED SECONDARY BATTERY MODULE MANAGEMENT SYSTEM

CROSS REFERENCE TO RELATED APPLICATIONS

This application is based on Japanese Patent Application No. 2021-006532 filed on Jan. 19, 2021 and Japanese Patent Application No. 2021-142270 filed on Sep. 1, 2021, the disclosure of which is incorporated herein by reference.

TECHNICAL FIELD

The present disclosure relates to a used secondary battery module management system.

BACKGROUND

A battery assembly formed by combining a plurality of secondary battery modules has been widely used. The secondary battery modules deteriorate with the use of the battery assembly, but their degrees of deterioration vary from one secondary battery module to another. Therefore, even when the degrees of deterioration of some of the secondary battery modules in the battery assembly exceed a criterion, the battery assembly cannot be used as a whole. In such a case, usable secondary battery modules whose degrees of deterioration are low are taken out from the battery assembly to be reused. When a battery assembly is reconstituted, that is, rebuilt using used secondary battery modules, it is necessary to combine the secondary battery modules in consideration of the degree of deterioration of each secondary battery module. It is conceivable from the viewpoint of extending the life to combine secondary battery modules whose degrees of deterioration are equivalent to each other.

SUMMARY

The present disclosure provides a used secondary battery module management system server that manages a manufacture of a battery assembly. The server stores, in a memory, a correspondence relationship of each of secondary battery modules among identification information, ranks, and status information. The server extracts an available rank from the ranks in response to a rebuilding request for the battery assembly. The available rank is a rank in which the number of the secondary battery modules having the status information indicating that the secondary battery modules are available is equal to or larger than the number of the secondary battery modules required to constitute the battery assembly. The server receives, from an external terminal, the identification information on each of selection secondary battery modules having an identical rank.

BRIEF DESCRIPTION OF DRAWINGS

The features and advantages of the present disclosure will become more apparent from the following detailed description made with reference to the accompanying drawings. In the drawings:

FIG. 3 is a conceptual view illustrating information stored in a storage unit in the first embodiment;

DETAILED DESCRIPTION

Figure 1:
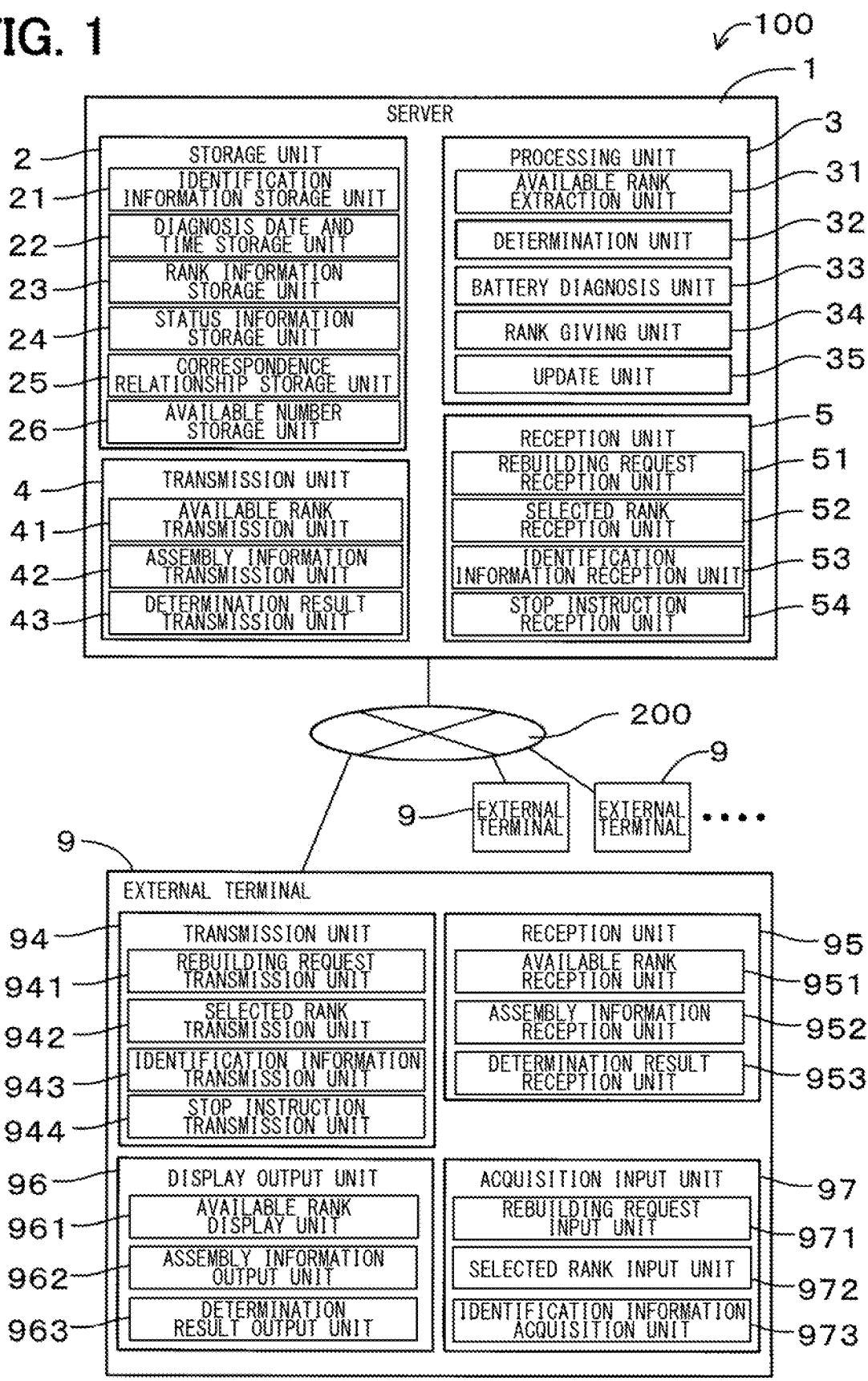
FIG. 1 is a conceptual view illustrating a configuration of a used secondary battery module management system in a first embodiment.

For example, degrees of deterioration of a plurality of secondary battery modules are measured, the secondary battery modules are given ranks according to the degrees of deterioration, and a database is created in which information on the given ranks are stored for the respective secondary battery modules. It is possible by using the database to provide information on the secondary battery modules with the rank of the degree of deterioration according to a user's request for replacement of the secondary battery module of a battery assembly or for rebuilding a battery assembly.

However, the secondary battery modules constituting a battery assembly have the same standard, and it is extremely difficult to determine their deteriorated states or ranks given based on the deteriorated states from the appearances of the secondary battery modules. Therefore, there is a difficulty that when a user takes out from a plurality of groups of used secondary battery modules ranked in advance, the user may erroneously take out a secondary battery module different from a secondary battery module based on the information provided from the database. It is difficult for the user to notice this mistake. As a result, misassembly occurs in which a secondary battery module whose degree of deterioration does not meet the user's request is assembled to a battery assembly. As the number of the ranks of the secondary battery modules is larger, the possibility of the misassembly becomes higher. That is, when a battery assembly is rebuilt by selecting, from used secondary battery modules to which ranks have been given, secondary battery modules of a desired rank and assembling the battery assembly, there is a difficulty that the above-described misassembly occurs.

The present disclosure provides a used secondary battery module management system server, a used secondary battery module management system external terminal, and a used secondary battery module management system capable of preventing misassembly of a used secondary battery module.

An exemplary embodiment of the present disclosure provides a used secondary battery module management system server configured to manage a manufacture of a battery assembly. The used secondary battery module management system server includes a storage unit, an available rank extraction unit, an available rank transmission unit, an identification information reception unit, a determination unit, and a determination result transmission unit. The storage unit is configured to (i) store identification information on each of secondary battery modules used, rank information on ranks of the secondary battery modules based on a degree of deterioration of each of the secondary battery modules, and status information on a usage state of each of the secondary battery modules, and (ii) store a correspondence relationship of each of the secondary battery modules among the identification information, the rank information, and the status information. The available rank extraction unit is configured to extract an available rank form the ranks in response to a rebuilding request for the battery assembly. The available rank is a rank in which a number of the secondary battery modules included in the rank and having the status information that indicates that the secondary battery modules are available is equal to or larger than a number of the secondary battery modules required to constitute the battery assembly. The available rank transmission unit is configured to transmit the available rank to an external terminal. The identification information reception unit is configured to receive, from the external terminal, the identification information on each of selection secondary battery modules having an identical rank. The selection secondary battery modules is selected from the secondary battery modules to which the ranks have been given based on the available rank. The determination unit is configured to determine, based on the correspondence relationship stored in the storage unit, whether the identification information received by the identification information reception unit matches with the identification information on the secondary battery modules to which the identical rank included in the available rank has been given. The determination result transmission unit is configured to transmit, to the external terminal, a determination result in the determination unit.

Another exemplary embodiment of the present disclosure provides a used secondary battery module management system external terminal configured to manage a manufacture of a battery assembly. The used secondary battery module management system external terminal includes an available rank reception unit, an available rank display unit, an identification information acquisition unit, an identification information transmission unit, a determination result reception unit, and a determination result output unit. The available rank reception unit is configured to receive an available rank from a server. The available rank is a rank included in ranks defined based on degrees of deterioration of secondary battery modules. The number of secondary battery modules that belongs to the available rank being equal to or larger than the number of secondary battery modules required to constitute a battery assembly required to be rebuilt. The available rank display unit is configured to display the available rank received by the available rank reception unit. The identification information acquisition unit is configured to acquire identification information on each of secondary battery modules selected, based on the available rank displayed on the available rank display unit, from the secondary battery modules to which the ranks are given in advance. The identification information transmission unit is configured to transmits, to the server, the identification information acquired by the identification information acquisition unit. The determination result reception unit is configured to receive a determination result as to whether the identification information that has been transmitted matches with identification information on the secondary battery modules belonging to an identical rank in the available rank. The determination result output unit is configured to output the determination result received by the determination result reception unit.

Another exemplary embodiment of the present disclosure provides a used secondary battery module management system that includes the used secondary battery module management system server and the used secondary battery module management system external terminal.

In the used secondary battery module management system server, an available rank, in which secondary battery modules whose number is equal to or larger than the number of the secondary battery modules required to constitute a battery assembly are available, is extracted in response to a rebuilding request for the battery assembly. Then, it is determined whether identification information on each of the secondary battery modules of the identical rank, selected based on the available rank from groups of the used battery modules to which ranks have been given, matches the identification information on the secondary battery module belonging to the identical rank in the available rank. As a result, misassembly of the secondary battery module can be prevented by determining whether the secondary battery module selected from the groups of the used secondary battery modules belongs to the same correct rank.

In the used secondary battery module management system external terminal, an available rank that is a rank in which the secondary battery modules whose number is equal to or larger than the number of the secondary battery modules required to constitute a battery assembly required to be rebuilt are available is received from the server, and the available rank is displayed. Then, the identification information on each of the secondary battery modules selected, based on the displayed available rank, from the groups of the used secondary battery modules to which ranks are given in advance is acquired and transmitted to the server. A determination result as to whether the transmitted identification information matches with the identification information on the secondary battery module belonging to the identical rank in the available rank is received, and the determination result is output. As a result, misassembly of the secondary battery module can be prevented by a user confirming in the external terminal whether the secondary battery module selected from the groups of the used secondary battery modules belongs to the same correct rank.

Since the used secondary battery module management system includes the used secondary battery module management system server and the used secondary battery module management system external terminal, misassembly of the secondary battery module can be prevented by determining with the server whether the secondary battery module selected from the groups of the used secondary battery modules belongs to the same correct rank and by a user confirming it in the external terminal.

First Embodiment

Embodiments of the used secondary battery module management system, the management system server, and the management system external terminal will be described with reference to FIGS. 1 to 6.

As illustrated in FIG. 1, a used secondary battery module management system 100 for manufacturing and managing a battery assembly in a first embodiment includes a used secondary battery module management system server 1 (hereinafter, also referred to as the "server 1" in the present specification) and a used secondary battery module management system external terminal 9 (hereinafter, also referred to as the "external terminal 9" in the present specification).

First, the server 1 according to the first embodiment includes a storage unit 2, an available rank extraction unit 31, an available rank transmission unit 41, an identification information reception unit 53, a determination unit 32, and a determination result transmission unit 43, as illustrated in FIG. 1.

The storage unit 2 illustrated in FIG. 1 stores identification information on the used secondary battery module, ranks given based on the degrees of deterioration of the secondary battery modules, and status information on the usage states of the secondary battery modules, and stores correspondence relationships among the identification information, rank information, and the status information.

In response to a rebuilding request for a battery assembly, the available rank extraction unit 31 extracts a rank as an available rank Ra from the ranks. The available rank Ra is a rank in which the number of the secondary battery modules included in the rank is equal to or larger than the number of the secondary battery modules required to constitute the battery assembly and the status information of the secondary battery modules indicates that of the secondary battery modules are available The available rank transmission unit 41 transmits the available rank Ra to the external terminal 9.

The identification information reception unit 53 receives, from the external terminal 9, the identification information on each of secondary battery modules M of an identical rank Rs selected, based on the available rank Ra, from the groups of the used battery modules to which the ranks have been given.

Based on the correspondence relationships stored in the storage unit 2, the determination unit 32 determines whether the identification information received by the identification information reception unit 53 matches the identification information on the secondary battery modules belonging to the identical rank Rs in the available rank Ra.

The determination result transmission unit 43 transmits a determination result in the determination unit 32 to the external terminal 9.

Hereinafter, the server 1 according to the first embodiment will be described in detail.

The server 1 includes, for example, a processor, a memory and the like and performs processing related to used secondary battery module management by executing a control program stored in the memory. The memory cited here is a non-transitory tangible storage medium non-temporarily storing computer-readable programs and data. The non-transitory tangible storage medium is implemented by a semiconductor memory, a magnetic disk, or the like. The processor is also referred to as a server processor.

As illustrated in FIG. 1, the server 1 according to the first embodiment includes the storage unit 2, a processing unit 3, a transmission unit 4, and a reception unit 5.

Figure 2:
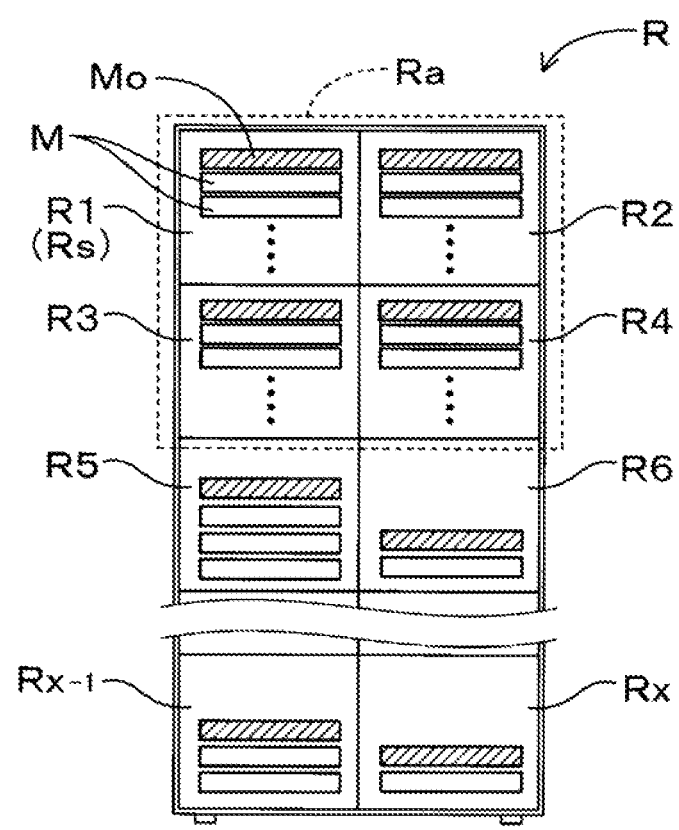
FIG. 2 is a conceptual view illustrating a configuration of a storage place in the first embodiment.

The storage unit 2 illustrated in FIG. 1 is provide by a rewritable nonvolatile memory, and includes an identification information storage unit 21, a diagnosis date and time storage unit 22, a rank information storage unit 23, a status information storage unit 24, a correspondence relationship storage unit 25, and an available number storage unit 26. The identification information storage unit 21 stores the identification information on the collected used secondary battery modules. The form of the identification information is not limited, and a manufacturing number or a two-dimensional code individually given to each of the secondary battery modules when manufactured can be adopted. In the first embodiment, a two-dimensional code that easily ensures high reading accuracy and display stability is adopted as the identification information. The identification information storage unit 21 can store the identification information on the used secondary battery modules when the used secondary battery modules are collected. In the first embodiment, the secondary battery modules M collected can be stored in a storage place R by being sorted into ranks R1 to Rx to be described later, as illustrated in FIG. 2.

The diagnosis date and time storage unit 22 illustrated in FIG. 1 stores, for each secondary battery module, date and time when the degree of deterioration of the secondary battery module is diagnosed. In the first embodiment, the degrees of deterioration of the used secondary battery modules collected are diagnosed by a battery diagnosis unit 33 included in the processing unit 3 to be described later, a rank is given to each secondary battery module by a rank giving unit 34, and the date and time when the diagnose is performed is stored in the diagnosis date and time storage unit 22. As illustrated in FIG. 2, the secondary battery modules M are disposed such that in the storage place R, the secondary battery module with older diagnosis date and time is more preferentially and easily taken out for each rank and a secondary battery module Mo with the oldest diagnosis date and time is first taken out.

The rank information storage unit 23 illustrated in FIG. 1 stores information on a rank given, by the rank giving unit 34 to be described later, to each used secondary battery module according to the degree of deterioration of the secondary battery module. In the present embodiment, the ranks R1 to Rx are set according to the degrees of deterioration, and the ranks R1 to Rx are stored as the rank information, as illustrated in FIG. 3. As the rank information, the diagnosis date and time for the secondary battery module Mo with the oldest diagnosis date and time for secondary battery module is stored, for each rank, as specific diagnosis date and time.

The status information storage unit 24 illustrated in FIG. 1 stores status information on the usage state of the secondary battery module. The status information indicates what state the secondary battery module is in. The status information includes, for example, an available state in which the secondary battery module is stored in the storage place, a tentatively reserved state in which the secondary battery module is selected from a group of the secondary battery modules included in a selected rank to be described later, and an assembled state in which the secondary battery module is assembled to a battery assembly.

The correspondence relationship storage unit 25 illustrated in FIG. 1 stores correspondence relationships among the identification information on the secondary battery module stored in the identification information storage unit 21, the rank information stored in the rank information storage unit 23, and the status information stored in the status information storage unit 24. In the present embodiment, the correspondence relationship storage unit 25 stores correspondence relationships among rank information Rn, identification information Mn, and status information St, as illustrated in FIG. 3. In the first embodiment, the correspondence relationship storage unit 25 also stores the diagnosis date and time for every secondary battery module.

As illustrated in FIG. 3, the available number storage unit 26 illustrated in FIG. 1 stores, for each rank, the number of the secondary battery modules belonging to each of the ranks R1 to Rx as an available number (An).

The processing unit 3 illustrated in FIG. 1 is provided by a predetermined arithmetic device, and includes the available rank extraction unit 31, the determination unit 32, the battery diagnosis unit 33, the rank giving unit 34, and an update unit 35. In response to a rebuilding request to be described later, the available rank extraction unit 31 extracts the available rank Ra in which the secondary battery modules whose number is equal to or larger than the number of the secondary battery modules required to constitute a battery assembly are available. That is, by referring to the available numbers An stored in the available number storage unit 26 and illustrated in FIG. 3, the available rank extraction unit 31 extracts, as the available rank Ra, a rank in which the available number An is equal to or larger than the number of the secondary battery modules required to constitute a battery assembly. It is preferable that the available rank extraction unit 31 extracts more preferentially a rank with older specific diagnosis date and time to be described. Note that "extract more preferentially a rank with older specific diagnosis date and time" means that when the ranks are sequentially extracted, a rank with older specific diagnosis date and time is extracted more preferentially. Note that the battery assembly is formed by combining a plurality of the secondary battery modules and is also referred to as a battery pack. The numbers of the secondary battery modules required to constitute battery assembly are set in advance for the respective battery assembly.

Based on the correspondence relationships stored in the correspondence relationship storage unit 25, the determination unit 32 illustrated in FIG. 1 determines whether the identification information received by the identification information reception unit 53 to be described later matches the identification information Mn on the secondary battery module belonging to the identical rank Rs in the available rank Ra illustrated in FIG. 3.

In the first embodiment, the determination unit 32 illustrated in FIG. 1 further determines whether the diagnosis date and time of the degree of deterioration of the secondary battery module selected based on the available rank is within a predetermined period. The predetermined period can be appropriately set, and can be set based on, for example, a period when there is a risk that the used secondary battery module may be over discharged due to self-discharge during storage, or a period when there is a risk that the rank may be changed due to a deterioration in battery performance during storage.

In the first embodiment, the determination unit 32 illustrated in FIG. 1 further determines whether the secondary battery modules selected based on the available rank Ra include the secondary battery module Mo with the oldest diagnosis date and time of the degree of deterioration in the rank Rs to which the secondary battery modules belong. Alternatively, the determination unit 32 may further determine whether the secondary battery modules selected based on the available rank Ra are selected in chronological order of the diagnosis date and time of the degree of deterioration in the rank Rs to which the secondary battery modules belong.

The battery diagnosis unit 33 illustrated in FIG. 1 diagnoses the degree of deterioration of the collected secondary battery module. The diagnosis method is not limited, and a publicly known method can be used. In the first embodiment, the battery diagnosis unit 33 diagnoses the degree of deterioration of the secondary battery module based on a battery characteristic related to a transition of a battery state in a predetermined voltage section of the secondary battery module. The battery characteristic of the secondary battery module can be a characteristic based on, for example, a voltage transition or temperature transition in a predetermined voltage section of the secondary battery module. The voltage transition can be calculated based on, for example, at least one of battery information such as a section capacity in a predetermined voltage section of the secondary battery module, a ratio of a voltage change of the secondary battery module to a capacity change of the secondary battery module in a predetermined voltage section, and a ratio of a voltage change of the secondary battery module to an elapsed time in a predetermined voltage section. The predetermined voltage section can be a voltage section in which the degree of deterioration and the transition of the battery state of the secondary battery module show a correlation relationship. Such a voltage section can be set based on the type or configuration of the secondary battery module, or can be created by machine learning based on training data acquired in advance. The predetermined voltage section for acquiring the battery characteristic of the secondary battery module can be set or appropriately changed for each secondary battery module. It may be set to a section in which full capacity is acquired. Alternatively, a discharge voltage characteristic or a charge voltage characteristic may be used as the battery characteristic.

In the first embodiment, the battery diagnosis unit 33 estimates the full capacity based on the battery characteristic. The full capacity can be estimated using a correspondence relationship between the battery characteristic and the full capacity. The correspondence relationship can be in the form of a regression equation, a map, a graph, a table, or the like created by machine learning based on the training data acquired in advance. When the regression equation is used as a prediction model, for example, linear regression, LASSO regression, Ridge regression, decision tree, or support vector regression can be used. Then, the battery diagnosis unit 33 in the first embodiment compares an estimation result of the full capacity of the used secondary battery module based on the battery characteristic with an estimated value derived from an estimation equation for estimating the full capacity of the secondary battery module stored in advance, and determines the degree of deterioration of the used secondary battery module.

Note that the diagnosis of the degree of deterioration of the secondary battery module by the battery diagnosis unit 33 is not limited thereto. The diagnosis may be performed by charging and discharging the secondary battery module with a device provided in a vehicle or the like or with a charging and discharging machine provided outside a vehicle while the secondary battery module is mounted on the vehicle or the like in the form of a battery assembly. Alternatively, it may be performed by charging and discharging the secondary battery module with a charging and discharging machine provided outside a vehicle in the form of a battery assembly unloaded from the vehicle or the like or in the form of an individual secondary battery module after being taken out from a battery assembly.

The rank giving unit 34 illustrated in FIG. 1 give a rank to the secondary battery module based on a diagnosis result in the battery diagnosis unit 33. In the first embodiment, the ranks R1 to Rx are given to the respective secondary battery modules, as illustrated in FIG. 3. The number of the ranks and the criteria for ranking are not particularly limited, and can be appropriately set.

When receiving a selected rank Rs from the external terminal 9 to be described later, the update unit 35 illustrated in FIG. 1 updates the available number of the secondary battery modules in the selected rank Rs, the available number being stored in the available number storage unit 26, to a number obtained by subtracting the number of the secondary battery modules required to constitute a battery assembly, as illustrated in FIG. 3. When receiving, from the external terminal 9 to be described later, the identification information on the secondary battery module selected from the selected rank Rs, the update unit 35 updates the corresponding status information stored in the status information storage unit 24 to the tentatively reserved state based on the correspondence relationships between the identification information and the status information stored in the correspondence relationship storage unit 25, as illustrated in FIG. 3. Furthermore, when all the determination results in the determination unit 32 are affirmative, the update unit 35 updates the status information on the secondary battery module selected as described above, the status information being stored in the status information storage unit 24, to the assembled state. In addition, when a stop instruction reception unit 54 to be described later receives a stop instruction to stop the rebuilding from the external terminal 9, the update unit 35 updates the available number of the secondary battery modules stored in the available number storage unit 26 by returning to the state before the update, and updates the status information on the secondary battery module selected as described above, the status information being stored in the status information storage unit 24, by returning to the available state.

The transmission unit 4 and the reception unit 5 illustrated in FIG. 1 is provided by arithmetic devices that are connected to a communication network 200 in a wired or wireless manner and can transmit and receive data. The transmission unit 4 includes the available rank transmission unit 41, an assembly information transmission unit 42, and the determination result transmission unit 43. The available rank transmission unit 41 transmits, to the external terminal 9, the available rank Ra that is illustrated in FIG. 2 and extracted by the available rank extraction unit 31 and the specific diagnosis date and time stored in the rank information storage unit 23. The assembly information transmission unit 42 transmits, to the external terminal 9, assembly information on the secondary battery module belonging to the selected rank Rs. The assembly information includes information on the rank of the secondary battery modules to be assembled, parts other than the secondary battery modules constituting a battery assembly, an assembly procedure, and the like. The determination result transmission unit 43 transmits a determination result by the determination unit 32 to the external terminal 9.

The reception unit 5 illustrated in FIG. 1 includes a rebuilding request reception unit 51, a selected rank reception unit 52, the identification information reception unit 53, and the stop instruction reception unit 54. The rebuilding request reception unit 51 receives, from the external terminal 9, the rebuilding request for a battery assembly input to the external terminal 9. The selected rank reception unit 52 receives, from the external terminal 9, the selected rank Rs that is a rank selected from the available rank Ra in the external terminal 9. The identification information reception unit 53 receives, from the external terminal 9, the identification information on the secondary battery module. The stop instruction reception unit 54 receives, from the external terminal 9, an instruction to stop the assembly of a battery assembly.

Next, the external terminal 9 in the first embodiment will be described. As illustrated in FIG. 1, the external terminal 9 is connected to the server 1 via the communication network 200 in a wired or wireless manner. A plurality of the external terminals 9 can be simultaneously connected to the server 1.

The external terminal 9 includes, for example, a processor, a memory and the like and performs processing related to used secondary battery module management by executing a control program stored in the memory. The memory cited here is a non-transitory tangible storage medium non-temporarily storing computer-readable programs and data. The non-transitory tangible storage medium is implemented by a semiconductor memory, a magnetic disk, or the like. The processor is also referred to as a terminal processor.

As illustrated in FIG. 1, the external terminal 9 has an available rank reception unit 951, an available rank display unit 961, an identification information acquisition unit 973, an identification information transmission unit 943, a determination result reception unit 953, and a determination result output unit 963.

The available rank reception unit 951 receives, of the ranks defined based on the degrees of deterioration of the secondary battery modules, the available rank Ra that is a rank in which the secondary battery modules whose number is equal to or larger than the number of the secondary battery modules required to constitute a battery assembly required to be rebuilt are available, from the server.

The available rank display unit 961 displays the available rank Ra received by the available rank reception unit 951.

Based on the available rank Ra displayed on the available rank display unit 961, the identification information acquisition unit 973 acquires the identification information on each of the secondary battery modules selected from the used secondary battery modules to which the ranks are given in advance.

The identification information transmission unit 943 transmits, to the server 1, the identification information acquired by the identification information acquisition unit 973.

The determination result reception unit 953 receives a determination result as to whether the identification information transmitted by the identification information transmission unit 943 matches the identification information on the secondary battery module belonging to the identical rank Rs in the available rank Ra.

The determination result output unit 963 outputs the determination result received by the determination result reception unit 953.

Hereinafter, the configuration of the external terminal 9 will be described in detail.

As illustrated in FIG. 1, the external terminal 9 includes a transmission unit 94, a reception unit 95, a display output unit 96, and an acquisition input unit 97.

The transmission unit 94 and the reception unit 95 include arithmetic units that are connected to the communication network 200 in a wired or wireless manner and can transmit and receive data. In the first embodiment, the transmission unit 94 includes a rebuilding request transmission unit 941, a selected rank transmission unit 942, and a stop instruction transmission unit 944 in addition to the identification information transmission unit 943 described above. The rebuilding request transmission unit 941 transmits, to the server 1, a rebuilding request input to a rebuilding request input unit 971 to be described later. The selected rank transmission unit 942 transmits, to the server, the selected rank Rs selected from the available rank Ra displayed on the available rank display unit 961. A user can input the rebuilding request and select the selected rank Rs via the external terminal 9. The stop instruction transmission unit 944 transmits, to the server 1, a stop instruction based on a determination by a user to stop the rebuilding of a battery assembly.

The reception unit 95 illustrated in FIG. 1 includes an assembly information reception unit 952 in addition to the available rank reception unit 951 and the determination result reception unit 953 described above. The assembly information reception unit 952 receives, from the server 1, assembly information on the secondary battery modules belonging to the selected rank Rs. Note that the transmission unit 94 and the reception unit 95 may be able to transmit and receive all information between the server 1 and the external terminal 9.

The display output unit 96 illustrated in FIG. 1 provides information in a form in which a user can acquire and understand the information, and includes a display that displays and outputs information, a printer that outputs information by printing on paper, and the like. The display output unit 96 has an assembly information output unit 962 in addition to the available rank display unit 961 and the determination result output unit 963 described above. The available rank display unit 961, the assembly information output unit 962, and the determination result output unit 963 may display information with a display or may print information with a printer. In the first embodiment, the available rank display unit 961 displays information with a display, and the assembly information output unit 962 and the determination result output unit 963 print information with a printer.

In the first embodiment, the available rank display unit 961 is configured such that: the diagnosis date and time for the secondary battery module Mo with the oldest diagnosis date and time of the degree of deterioration among those of the degrees of deterioration of the secondary battery modules included in each of the ranks R1 to Rx is specified for each of the ranks R1 to Rx; and a rank with older specified diagnosis date and time is displayed more preferentially. After the specified diagnosis date and time, extracted together with the available rank Ra by the available rank extraction unit 31, is received, it can be used as the specific diagnosis date and time. In the available rank display unit 961, "a rank with older specified diagnosis date and time is displayed more preferentially" means that a rank with older specified diagnosis date and time is displayed such that a user can easily understand it. For example, the rank with the oldest specified diagnosis date and time can be displayed at the top, and the ranks other than that are displayed thereafter in chronological order of the specified diagnosis date and time. Alternatively, only the rank with the oldest specified diagnosis date and time may be first displayed, and when a user performs an operation to display the ranks other than the rank with the oldest specified diagnosis date and time, the ranks other than that may be displayed in chronological order of the specified diagnosis date and time. Note that the display output unit 96 may include a display unit that displays other information.

The acquisition input unit 97 illustrated in FIG. 1 includes a device to which a user can input information. The acquisition input unit 97 has a rebuilding request input unit 971 and a selected rank input unit 972 in addition to the identification information acquisition unit 973 described above The rebuilding request input unit 971 is configured to allow a user to input a rebuilding request, and the rebuilding request includes information on a battery assembly to be rebuilt. The form of the rebuilding request input unit 971 is not limited, and an input device, to which, for example, the model number of or the identification information on the battery assembly can be input, can be adopted.

The selected rank input unit 972 illustrated in FIG. 1 is configured such that a user can select, as the selected rank Rs, one rank from the available rank Ra displayed on the available rank display unit 961. Since the rank with the oldest specified diagnosis date and time is preferentially displayed on the available rank display unit 961, as described above, a user is usually urged to select, from the displayed available rank Ra, the rank with the oldest specified diagnosis date and time as the selected rank Rs.

The identification information acquisition unit 973 illustrated in FIG. 1 acquires, based on the selected rank Rs in the available rank Ra, the identification information on each of the necessary number of the secondary battery modules taken out from the group of the secondary battery modules sorted into a rank matching the selected rank Rs in the storage place R. As described above, the identification information can be, for example, a two-dimensional code, and in this case, the acquisition of the identification information can be performed by a two-dimensional code reader.

Figure 4:
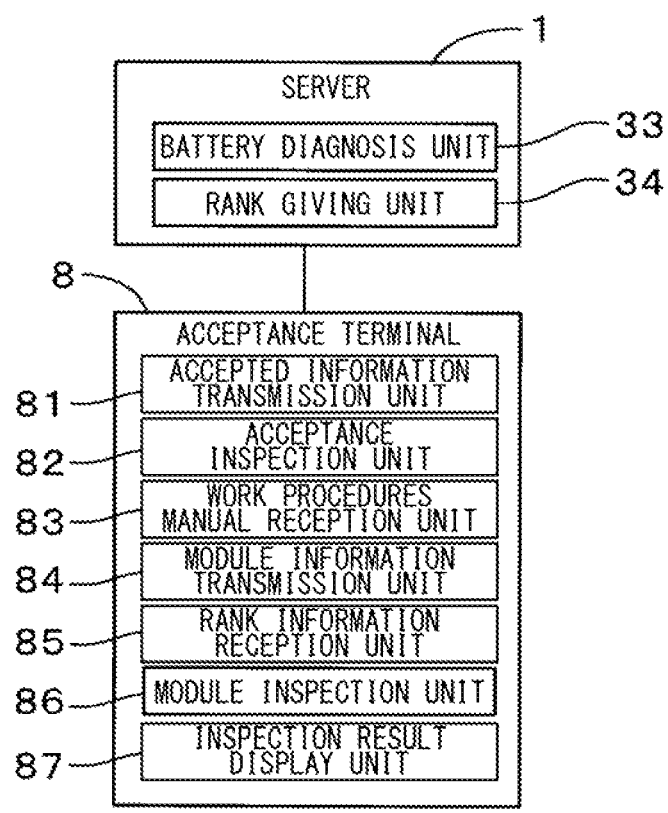
FIG. 4 is another conceptual view illustrating the configuration of the used secondary battery module management system in the first embodiment.

In taking out an available secondary battery module from a used battery assembly and storing it, an acceptance terminal 8 connected to the server 1 can be used as illustrated in FIG. 4. As illustrated in FIG. 4, the acceptance terminal 8 includes an accepted information transmission unit 81, an acceptance inspection unit 82, a work procedures manual reception unit 83, a module information transmission unit 84, a rank information reception unit 85, a module inspection unit 86, and an inspection result display unit 87.

The accepted information transmission unit 81 illustrated in FIG. 4 transmits, to the server 1, accepted information on a used battery assembly. As acceptance processing, information on a battery assembly is transmitted to the server 1. The information on a battery assembly can be the identification information on the battery assembly, the information on a device on which the battery assembly is mounted, or the vehicle information on a vehicle when the battery assembly is mounted thereon. The vehicle information can include the model of the vehicle, travel information, a failure history, used areas, and the like. The server 1 stores the received information on a battery assembly in a predetermined storage unit (not illustrated).

The acceptance inspection unit 82 illustrated in FIG. 4 inspects the accepted battery assembly and transmits an inspection result to the server 1. In the inspection, it is inspected whether there is damage, such as external damage or a missing part, in the battery assembly. The battery assembly determined not to be damaged is disassembled according to a procedure manual received from the server 1 by the work procedures manual reception unit 83. Then, the module information transmission unit 84 transmits information on the secondary battery module to the server 1. In the server 1, the battery diagnosis unit 33 diagnoses the degree of deterioration, and the rank giving unit 34 performs ranking. The rank information reception unit 85 receives, from the server 1, the rank information including a rank. The module inspection unit 86 inspects whether there is a defect in the secondary battery module to which the rank has been given. The inspection result display unit 87 displays an inspection result in the module inspection unit 86. Referring to the inspection result, a user stores the secondary battery module by sorting into the corresponding one of the ranks R1 to Rx in the storage place R.

Next, a flow of accepting and storing the used secondary battery module in the used secondary battery module management system according to the first embodiment will be described below.

Figure 5:
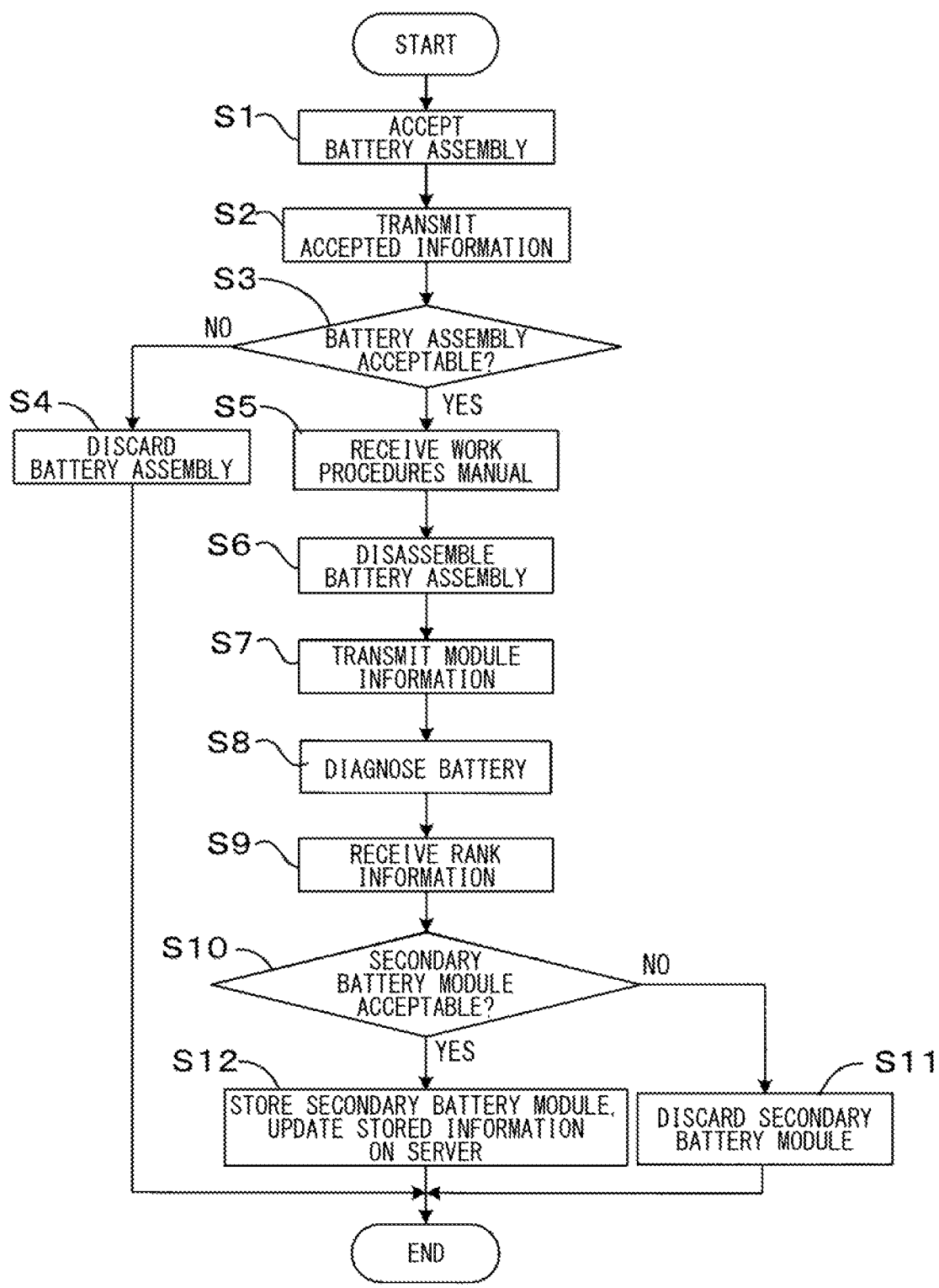
FIG. 5 is a flowchart for explaining steps of accepting the used secondary battery module in the first embodiment.

First, a used battery pack is accepted in a step S1, as illustrated in FIG. 5. The used battery pack can be, for example, what is mounted on a vehicle. Next, in a step S2, the accepted information transmission unit 81 of the acceptance terminal 8 transmits the accepted information to the server 1, and the server 1 stores the accepted information.

Thereafter, in a step S3 of FIG. 5, the acceptance inspection unit 82 of the acceptance terminal 8 performs acceptance inspection on the battery assembly. When it is determined in the step S3 that the battery assembly is unacceptable, the flow proceeds to No in the step S3. In a step S4, the accepted battery assembly is discarded. On the other hand, when it is determined in the step S3 that the battery assembly is acceptable, the flow proceeds to Yes in the step S3. In a step S5, the work procedures manual reception unit 83 receives a work procedures manual from the server 1. Then, in a step S6, the accepted battery assembly is disassembled according to the work procedures manual and the secondary battery module is taken out. In a step S7, the module information transmission unit 84 transmits, to the server 1, the information on the secondary battery module. The server 1 stores, of the received information on the secondary battery module, the identification information in the identification information storage unit 21, and stores the information on other parts in a storage unit (not illustrated).

Next, in a step S8 illustrated in FIG. 5, the battery diagnosis unit 33 of the server 1 diagnoses the degree of deterioration of the secondary battery module, and the rank giving unit 34 performs ranking. Thereafter, the secondary battery module is charged. Then, in a step S9, the rank information reception unit 85 of the acceptance terminal 8 receives, from the server 1, the rank information including the rank. Thereafter, in a step S10, the module inspection unit 86 inspects the secondary battery module, and transmits the inspection result to the server 1. When the secondary battery module is damaged, it is determined that the secondary battery module is unacceptable, and the flow proceeds to No in the step S10. In a step S11, the secondary battery module is discarded. On the other hand, when the secondary battery module is not damaged, it is determined that the secondary battery module is acceptable, and the flow proceeds to Yes in the step S10. In a step S12, the secondary battery module is stored by being sorted into the corresponding one of the ranks R1 to Rx in the storage place R, as illustrated in FIG. 2. In the storage place R, the secondary battery modules are disposed such that the secondary battery module Mo with the oldest diagnosis date and time for a secondary battery module is preferentially and easily taken out for each rank. Note that usable parts, taken out by disassembling the discarded battery assembly and secondary battery module, may be reused.

In the step S12 illustrated in FIG. 5, the server 1 stores, in the correspondence relationship storage unit 25, a correspondence relationship between the identification information on and the rank of the secondary battery module determined to be acceptable, and stores, in the diagnosis date and time storage unit 22, the diagnosis date and time of the degree of deterioration of the secondary battery module. In addition, the available number of the secondary battery modules for each rank, stored in the available number storage unit 26, is updated by adding the number of the accepted secondary battery modules.

Next, a flow of rebuilding a battery assembly in the used secondary battery module management system 100 according to the first embodiment will be described below.

Figure 6:
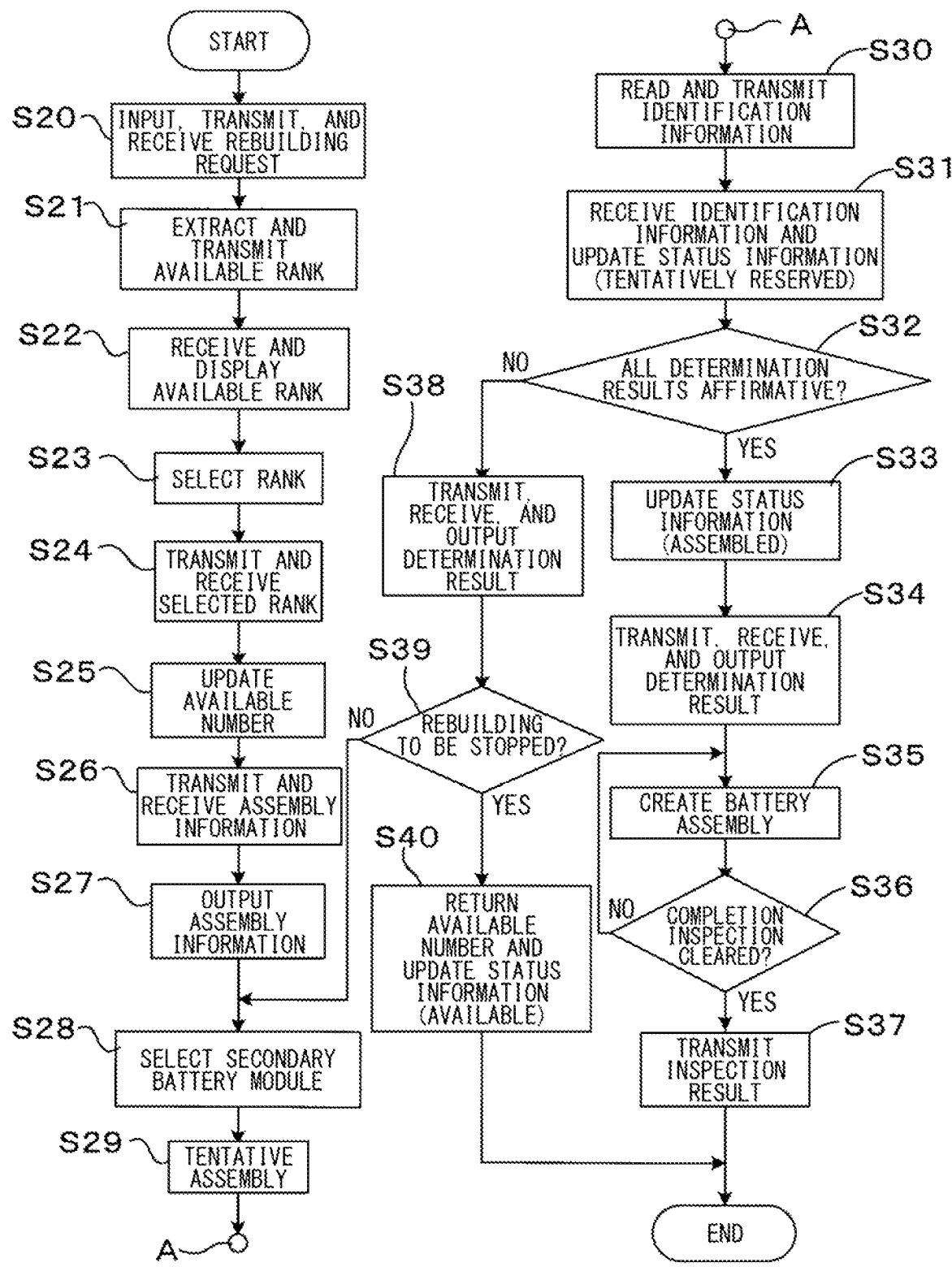
FIG. 6 is a flowchart for explaining steps of rebuilding a battery assembly in the first embodiment.

When a request for rebuilding the battery assembly occurs, a user first inputs a rebuilding request to the rebuilding request input unit 971 of the external terminal 9 in a step S20, as illustrated in FIG. 6. Then, the rebuilding request is transmitted from the rebuilding request transmission unit 941 of the external terminal 9, which is received by the rebuilding request reception unit 51 of the server 1. The flow proceeds to a step S21. In response to the rebuilding request received in the server 1, the available rank extraction unit 31 extracts the available rank Ra in which the secondary battery modules whose number is equal to or larger than the number of the secondary battery modules required to constitute the battery assembly are available. When the number of the secondary battery modules required to constitute the battery assembly is, for example, five, the ranks R1 to R4 illustrated in FIG. 3 are extracted as the available rank Ra. The available rank Ra is extracted in chronological order of the specific diagnosis date and time stored in the rank information storage unit 23. The extracted available rank Ra and the specific diagnosis date and time are transmitted to the external terminal 9 by the available rank transmission unit 41 of the server 1.

Then, in a step S22 illustrated in FIG. 6, the available rank reception unit 951 of the external terminal 9 receives the available rank Ra and the specific diagnosis date and time, and the available rank display unit 961 displays the available rank Ra. In the available rank display unit 961, the ranks R1 to R4 included in the available rank Ra are displayed in chronological order of the specific diagnosis date and time. In a step S23, a user can select, based on the display and from the available rank Ra, the rank R1 with older specific diagnosis date and time as the selected rank Rs.

Thereafter, in a step S24 illustrated in FIG. 6, the selected rank transmission unit 942 of the external terminal 9 transmits the selected rank Rs, which is a rank selected from the available rank Ra by a user, to the server 1. The selected rank reception unit 52 of the server 1 receives the selected rank. Then, in a step S25, the update unit 35 of the server 1 updates the available number of the secondary battery modules of the selected rank Rs stored in the available number storage unit 26 to a number obtained by subtracting the number of the secondary battery modules required to constitute the battery assembly. That is, the available number is updated to a number obtained by subtracting 5, which is the number of the secondary battery modules required to constitute the battery assembly, from 10, which is the available number of the rank R1 that is the selected rank Rs, as illustrated in FIG. 3.

Then, in a step S26, the assembly information transmission unit 42 of the server 1 transmits the assembly information on the secondary battery module to the external terminal 9. The assembly information reception unit 952 of the external terminal 9 receives the assembly information. Thereafter, in a step S27, the assembly information output unit 962 of the external terminal 9 prints and outputs the assembly information. Then, in a step S28, the necessary number of the secondary battery modules belonging to the selected rank Rs (i.e., rank R1) are selected and taken out in order from top to bottom from the storage place R.

Thereafter, in a step S29 illustrated in FIG. 6, tentative assembly of the secondary battery modules is performed according to the assembly information. Note that the tentative assembly means that the secondary battery modules are brought into a state in which they are assembled with each other and ready to be housed in the case of the battery assembly. In the state of the tentative assembly, replacement of the secondary battery modules is easier than in a state in which the secondary battery modules have been housed in the case of the battery assembly.

Then, in a step S30, the identification information acquisition unit 973 of the external terminal 9 reads a two-dimensional code, which is the identification information on the selected (i.e., the tentatively assembled) secondary battery module. The identification information transmission unit 943 transmits the identification information read to the server 1. Then, in a step S31, the identification information reception unit 53 of the server 1 receives the identification information. Based on this, the update unit 35 updates the status information stored in the status information storage unit 24, corresponding to the identification information, from the available state to the tentatively reserved state. Thereafter, in a step S32, the determination unit 32 of the server 1 determines whether by referring to the correspondence relationship storage unit 25, the identification information received by the identification information reception unit 53 matches the identification information on the secondary battery module belonging to the identical rank (i.e., the selected rank Rs) in the available rank Ra. The determination unit 32 further determines whether the diagnosis date and time of the degree of deterioration of the tentatively assembled secondary battery module is within a predetermined period. The determination unit 32 further determines whether the tentatively assembled secondary battery modules includes the secondary battery module with the oldest diagnosis date and time of the degree of deterioration in the rank Rs to which the secondary battery modules belong. Alternatively, it may be further determined whether the secondary battery modules are used in chronological order of the diagnosis date and time of the degree of deterioration in the rank Rs to which the secondary battery modules belong.

When all the determination results in the step S32 illustrated in FIG. 6 are affirmative, that is, when it is determined that: the identification information received by the identification information reception unit 53 matches the identification information on the secondary battery module belonging to the selected rank Rs; the diagnosis date and time of the degree of deterioration of the tentatively assembled secondary battery module is within a predetermined period; and the tentatively assembled secondary battery modules include the secondary battery module with the oldest diagnosis date and time of the degree of deterioration in the rank Rs to which the secondary battery modules belong or they are used in chronological order of the diagnosis date and time, the flow proceeds to Yes in the step S32.

Then, in a step S33, the update unit 35 of the server 1 updates the status information stored in the status information storage unit 24, corresponding to the identification information, from the tentatively reserved state to the assembled state. Thereafter, in a step S34, the determination result transmission unit 43 of the server 1 transmits a determination result to the external terminal 9. The determination result reception unit 953 of the external terminal 9 receives the determination result. Then, the determination result output unit 963 of the external terminal 9 prints and outputs the determination result.

Next, in a step S35 illustrated in FIG. 6, the tentatively assembled secondary battery modules are housed in the case of the battery assembly and other parts are attached according to the assembly information, whereby the battery assembly is created. Thereafter, the flow proceeds to a step S36, where a completion inspection is performed on the completed battery assembly. The completion inspection can be performed by an inspection device (not illustrated). Then, the flow proceeds to Yes in the step S36 when the completion inspection is cleared. An inspection result is transmitted to the server 1 in a step S37, and this flow is ended. When the completion inspection in the step S36 is not cleared, the flow proceeds to No in the step S36, where the step S35 is performed again.

On the other hand, when the determination result includes a negation in the step S32 illustrated in FIG. 6, the flow proceeds to No in the step S32. In a step S38, the determination result transmission unit 43 of the server 1 transmits the determination result to the external terminal 9, which is received by the determination result reception unit 953 of the external terminal 9. Then, the determination result output unit 963 of the external terminal 9 prints and outputs the determination result, showing a user that the selected secondary battery modules include an inappropriate one. In response to this, the user determines in a step S39 whether to stop the assembly of the battery assembly. When it is determined in the step S39 that the assembly of the battery assembly is not to be stopped, the flow proceeds to Yes in the step S39. The user selects the secondary battery module from the selected rank Rs in the step S28 again, and performs the subsequent steps.

On the other hand, when the user determines in the step S39 illustrated in FIG. 6 that the rebuilding of the battery assembly is to be stopped, the stop instruction transmission unit 944 of the external terminal 9 transmits to the server 1 a stop instruction for the rebuilding, which is received by the stop instruction reception unit 54 of the server 1. Then, in a step S40, the update unit 35 re-updates the available number of the secondary battery modules stored in the available number storage unit 26 by returning to the state before the update, and re-updates the status information stored in the status information storage unit 24, corresponding to the secondary battery module, by returning from the tentatively reserved state to the available state. The secondary battery module is returned to the storage place R, and the flow is ended.

Next, operational effects in the used secondary battery module management system server 1 according to the first embodiment will be described in detail.

According to the server 1 of the first embodiment, the available rank Ra in which the secondary battery modules whose number is equal to or larger than the number of the secondary battery modules required to constitute the battery assembly are available is extracted in response to a rebuilding request for the battery assembly. Then, it is determined whether the identification information on each of the secondary battery modules of the identical rank Rs selected, based on the available rank Ra, from the groups of the used battery modules to which the ranks have been given matches the identification information on the secondary battery module belonging to the identical rank Rs in the available rank. As a result, it can be determined whether the secondary battery module selected from the groups of the used battery modules belongs to the same correct rank Rs, so that misassembly of the secondary battery module can be prevented.

In the server 1 according to the first embodiment, the determination unit 32 further determines whether the diagnosis date and time of the degree of deterioration of each of the secondary battery modules selected based on the available rank Ra is within a predetermined period. As a result, a secondary battery module that is in an over-discharged state due to self-discharge of secondary battery module during its storage period can be prevented from being used. By preventing a secondary battery module in an over-discharged state from being included in a battery assembly, the performance of the battery assembly can be maintained. In addition, a secondary battery module with a rank changed due to a deterioration during its storage period can be prevented from being assembled.

In the server 1 according to the first embodiment, the determination unit 32 further determines: whether the secondary battery modules selected based on the available rank Ra include the secondary battery module with the oldest diagnosis date and time of the degree of deterioration in the rank Rs to which the secondary battery modules belong; or whether the secondary battery modules selected based on the available rank are sequentially selected in chronological order of the diagnosis date and time of the degree of deterioration in a rank to which the secondary battery modules belong. As a result, the secondary battery module with the oldest diagnosis date and time can be reused first and preferentially, so that the secondary battery module can be prevented from being in an over-discharged state during its storage period. In particular, when the number of the secondary battery modules required to constitute a battery assembly is large, it may take time to prepare the necessary number of the secondary battery modules. In such a case, the secondary battery module is likely to be in an over-discharged state during its storage period or in a deteriorated state during its storage. However, by adopting the above configuration, the secondary battery module can be suppressed from being in an over-discharged state during its storage period or in a deteriorated state during its storage even when the number of the secondary battery modules required to constitute a battery assembly is large, so that cost can be reduced.

In addition, in the server 1 according to the first embodiment, the rank information storage unit 23 stores, for each rank, a specific diagnosis date and time, which is the oldest diagnosis date and time among those of the degrees of deterioration of the secondary battery modules included in the rank Ra. The available rank extraction unit 31 extracts more preferentially a rank with older specific diagnosis date and time. As a result, the secondary battery modules can be sequentially reused in chronological order of the diagnosis date and time, so that the secondary battery module can be suppressed from being in an over-discharged state during its storage period or in a deteriorated state during its storage, similarly to the above.

The server 1 according to the first embodiment has the selected rank reception unit 52 that receives the selected rank Rs selected from the available rank Ra, and the assembly information transmission unit 42 that transmits, to the external terminal 9, the assembly information on each of the secondary battery modules belonging to the selected rank Rs. As a result, information necessary for assembling the secondary battery module can be presented to a user at an appropriate timing, so that assembly work can be made more efficient.

The server 1 according to the first embodiment has the update unit 35 that updates the information stored in the storage unit 2. The storage unit 2 has the available number storage unit 26 that stores the number of the secondary battery modules included in each rank, the status information on which indicate that they are available, as the available number of the secondary battery modules for each rank. The available rank extraction unit 31 extracts the available rank Ra based on the available numbers stored in the available number storage unit 26. When receiving the selected rank Rs from the external terminal 9, the update unit 35 updates the available number of the secondary battery modules in the selected rank Rs to a number obtained by subtracting the number of the secondary battery modules required to constitute a battery assembly. As a result, the available number of the secondary battery modules is updated at a timing when the selected rank Rs before completion of the battery assembly is determined. As a result, when a plurality of the external terminals 9 are connected to the server 1, and when the available number for the selected rank Rs is updated, for example, in a first external terminal 9, the available number for the rank is also updated in a second external terminal 9, so that the available number can be accurately displayed in the second external terminal 9.

In the server 1 according to the first embodiment, the update unit 35 updates the status information on the selected secondary battery modules to the assembled state when all the determination results in the determination unit 32 are affirmative. On the other hand, when it is determined to stop the rebuilding, the available number of the secondary battery modules stored in the available number storage unit 26 is updated by returning to the state before the update, and the status information on the selected secondary battery modules are updated to the available state. As a result, the status information on the secondary battery modules is updated when it is confirmed that the secondary battery modules will be reused in a battery assembly. When the rebuilding of the battery assembly is stopped, the available number is returned to the state before the update and the status information are updated, whereby the actually available secondary battery modules can be kept up to date.

The server 1 according to the first embodiment has the battery diagnosis unit 33 that diagnoses the degrees of deterioration of used secondary battery modules, and the rank giving unit 34 that gives the ranks R1 to Rx to the secondary battery modules based on the diagnosis results in the battery diagnosis unit 33. As a result, the secondary battery module can be ranked without separately preparing a diagnostic device.

In the server 1 according to the first embodiment, the battery diagnosis unit 33 diagnoses the degree of deterioration of a secondary battery module based on a battery characteristic related to the transition of the battery state in the predetermined voltage section of the secondary battery module. As a result, the degree of deterioration of the secondary battery module can be diagnosed in a short time and with high accuracy.

In the server 1 according to the first embodiment, the identification information is given when the used secondary battery module is manufactured. This eliminates the need to newly create identification information, thereby improving workability.

Operational effects by the used secondary battery module management system external terminal 9 in the first embodiment will be described in detail below.

The external terminal 9 according to the first embodiment receives, from the server 1, the available rank Ra that is a rank in which the secondary battery modules whose number is equal to or larger than the number of the secondary battery modules required to constitute a battery assembly required to be rebuilt are available, and displays the available rank Ra. Then, the identification information on each of the secondary battery modules selected, based on the displayed available rank Ra, from the groups of the used secondary battery modules to which the ranks are given in advance is acquired and transmitted to the server 1; a determination result as to whether the transmitted identification information matches the identification information on the secondary battery module belonging to the identical rank Rs in the available rank Ra is received; and the determination result is output. As a result, a user can confirm in the external terminal 9 whether the secondary battery module selected from the groups of the used secondary battery modules belongs to the same correct rank Rs, so that misassembly of the secondary battery module can be prevented.

In the external terminal 9 according to the first embodiment, the available rank display unit 961 specifies, for each rank, the oldest diagnosis date and time among those of the degrees of deterioration of the secondary battery modules included in each of the ranks R1 to Rx, and displays more preferentially a rank with older specified diagnosis date and time. As a result, the secondary battery module with the oldest diagnosis date and time can be reused preferentially, so that it is possible to suppress the secondary battery module from being in an over-discharged state during its storage period or the rank from being changed due to a deterioration in battery performance during its storage.

The external terminal 9 according to the first embodiment has a selected rank transmission unit 942 that transmits, to the server 1, the selected rank Rs selected from the available rank Ra displayed on the available rank display unit 961, an assembly information reception unit 952 that receives, from the server 1, the assembly information on the secondary battery module belonging to the selected rank Rs, and an assembly information output unit 962 that outputs the assembly information received by the assembly information reception unit 952. As a result, information necessary for assembling the secondary battery module can be presented to a user at an appropriate timing, so that assembly work can be made more efficient.

In the external terminal 9 according to the first embodiment, the identification information acquisition unit 973 acquires, as the identification information on the secondary battery module, the identification information given when the secondary battery module is manufactured. This eliminates the need to use new identification information, thereby improving workability.

The used secondary battery module management system 100 according to the first embodiment includes the used secondary battery module management system server 1 and the used secondary battery module management system external terminal 9. As a result, both the operational effects by the server 1 and the operational effects by the external terminal 9 described above can be achieved, so that misassembly of the secondary battery module can be prevented.

In the first embodiment, it is designed such that when the completion inspection is not cleared in the step S36 illustrated in FIG. 6, the flow proceeds to No in the step S36 and the step S35 is performed again. Alternatively, it may be designed such that: when the completion inspection is not cleared in the step S36, a user determines whether to stop the rebuilding; when it is determined that the building is to be stopped, the flow proceeds to the step S40, not to the step S35 from No in the step S36, in order to return the available number and return the status information to the available state; and the secondary battery module is returned to the storage place R.

In addition, in the first embodiment, it is designed such that after tentative assembly is performed in the step S29, the identification information is read and transmitted in the step S30 and the step S32 and the subsequent steps are performed, as illustrated in FIG. 6. As a result, the secondary battery module can be suppressed from being erroneously replaced with another secondary battery module after the identification information is transmitted, so that misassembly can be further prevented. Alternatively, it may be designed such that the steps S30 to S34 are performed without performing the tentative assembly in the step S29 and a battery assembly is created in the step S35. In this case, the tentative assembly is not performed, so that when the secondary battery module is selected again in the step S28 in the case where the determination result includes a negation in the step S32, it is not necessary to release the tentative assembly. As a result, it can be expected that workability will be improved.

Note that the server 1 and the external terminal 9 may be configured by combining individual devices having the respective configurations, and the individual devices may be disposed in different places. In the server 1, for example, the battery diagnosis unit 33, the rank giving unit 34, and the storage unit 2 may be configured by separate devices and may be disposed in different places. For example, it may be designed such that: after the battery diagnosis unit 33 diagnoses the degree of deterioration of a battery including battery assembly while the battery is mounted on a vehicle in a vehicle dealer or the like, the diagnosis result and the battery main body are sent to another location; the battery is disassembled in the another location, and the rank giving unit 34 gives a rank to each secondary battery module; and the storage unit 2 stores correspondence relationships between the identification information on and the rank of the secondary battery module.

According to the first embodiment, it is possible to provide the used secondary battery module management system server 1, the used secondary battery module management system external terminal 9, and the used secondary battery module management system 100 that are capable of preventing misassembly of the used secondary battery module, as described above.

Second Embodiment

Figure 7:
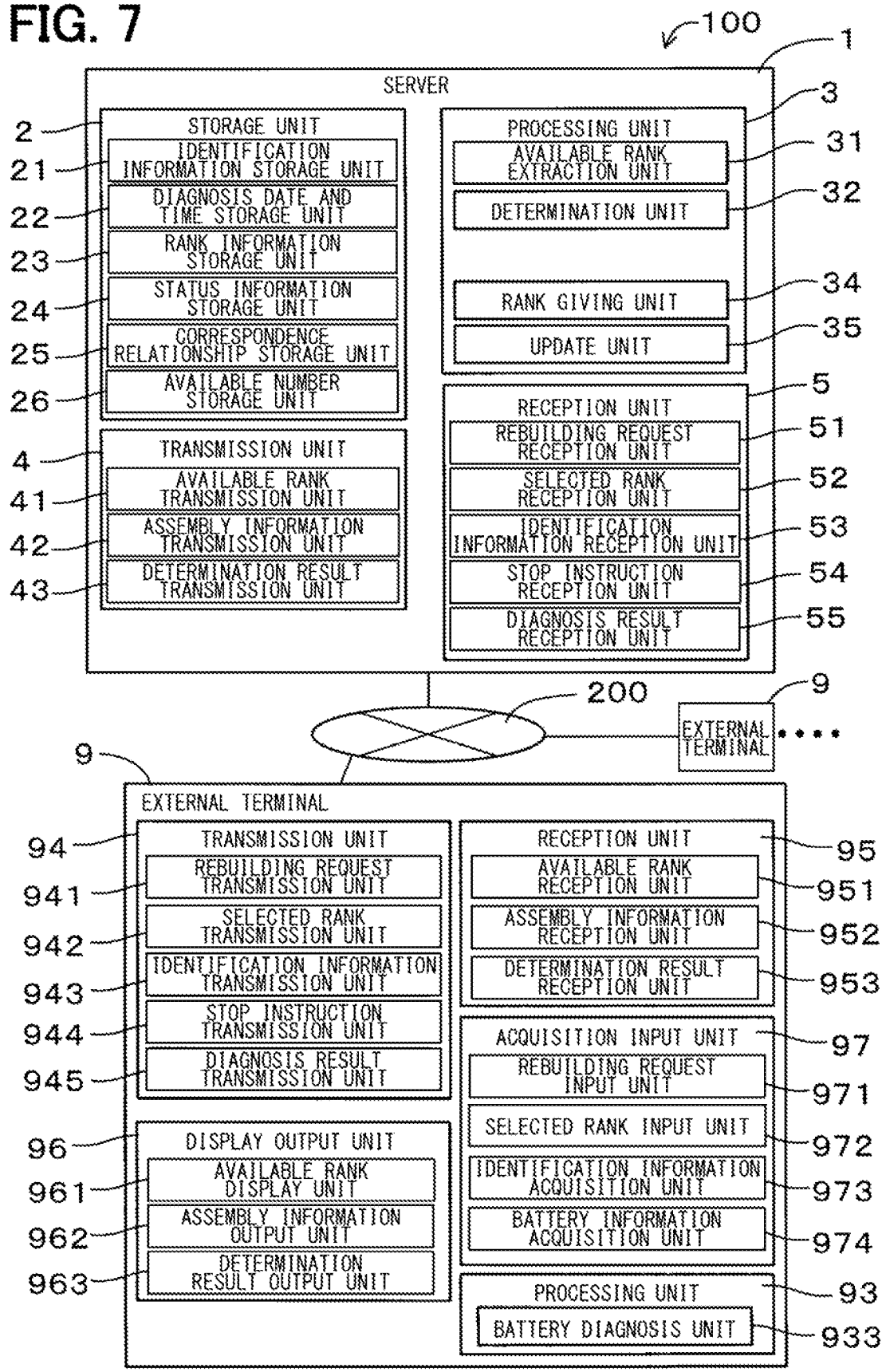
FIG. 7 is a conceptual view illustrating a configuration of a used secondary battery module management system in a second embodiment.

In the first embodiment described above, the server 1 includes the battery diagnosis unit 33 that diagnoses the degree of deterioration of the used secondary battery module, and the rank giving unit 34 that gives the ranks R1 to Rx to the secondary battery modules based on the diagnosis results in the battery diagnosis unit 33. Alternatively, in a second embodiment, the server 1 includes a diagnosis result reception unit 55 without having the battery diagnosis unit 33, as illustrated in FIG. 7. The external terminal 9 includes a battery diagnosis unit 933, a diagnosis result transmission unit 945, and a battery information acquisition unit 974.

In the second embodiment, the battery information acquisition unit 974 illustrated in FIG. 7 acquires battery information when the secondary battery module is charged and discharged. The acquisition of the battery information by the battery information acquisition unit 974 may be performed by charging and discharging the secondary battery module with a device provided in a vehicle or the like or with a charging and discharging machine that is an external device provided outside a vehicle while the secondary battery module is mounted on the vehicle or the like in the form of a battery assembly. Alternatively, the acquisition may be performed by charging and discharging the secondary battery module with a charging and discharging machine provided outside a vehicle in the form of a battery assembly unloaded from the vehicle or the like or in the form of individual secondary battery modules taken out from the battery assembly. Alternatively, the external terminal 9 may have the configuration of the charging and discharging machine.

The external terminal 9 illustrated in FIG. 7 includes a processing unit 93. The processing unit 93 includes a predetermined arithmetic unit and includes the battery diagnosis unit 933. The battery diagnosis unit 933 can have a configuration similar to that of the battery diagnosis unit 33 in the first embodiment. The battery diagnosis unit 933 diagnoses the degree of deterioration of the used secondary battery module, and transmits the diagnosis result to the server 1 by the diagnosis result transmission unit 945. The diagnosis result reception unit 55 of the server 1 receives the diagnosis result, and the rank giving unit 34 gives a rank, similarly to the first embodiment. Note that, of other configurations, the same configurations as those of the first embodiment will be denoted by the same reference signs, and the description thereof will be omitted.

According to the second embodiment, the same operational effects as those of the first embodiment are obtained. Furthermore, the server 1 does not need to include the battery diagnosis unit 33, so that the configuration of the server 1 can be simplified.

Third Embodiment

Figure 8:
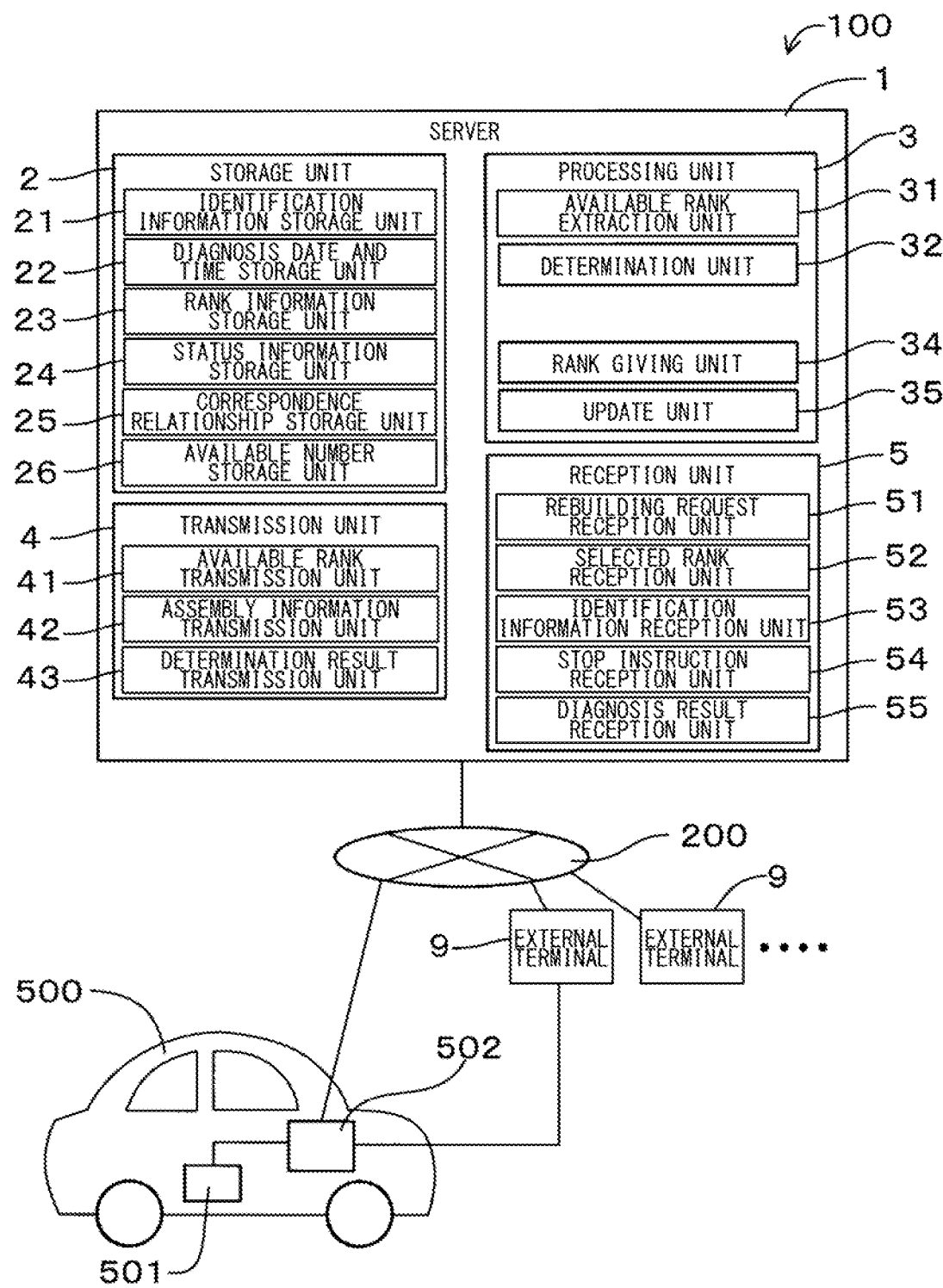
FIG. 8 is a conceptual view illustrating a configuration of a used secondary battery module management system in a third embodiment.

The server 1 of the first embodiment described above includes the battery diagnosis unit 33 that diagnoses the degree of deterioration of the used secondary battery module, and the rank giving unit 34 that gives the ranks R1 to Rx to the secondary battery modules based on the diagnosis results in the battery diagnosis unit 33. Alternatively, the server 1 according to a third embodiment includes the diagnosis result reception unit 55 without having the battery diagnosis unit 33, as illustrated in FIG. 8. A vehicle 500 has a battery diagnosis unit 501 and a communication unit 502. The battery diagnosis unit 501 can have a configuration similar to that of the battery diagnosis unit 33 in the first embodiment. The communication unit 502 of the vehicle 500 is connected to the server 1 in a wired or wireless manner via the communication network 200.

The battery diagnosis unit 501 mounted on the vehicle 500 illustrated in FIG. 8 charges and discharges the battery assembly mounted on the vehicle 500 using a device mounted on the vehicle 500 in order to diagnose the degree of deterioration of the secondary battery module (not illustrated) constituting the battery assembly. Then, the diagnosis result of the degree of deterioration is transmitted to the server 1 via the communication unit 502 mounted on the vehicle 500. The server 1 receives the diagnosis result by the diagnosis result reception unit 55. Alternatively, it may be designed such that the diagnosis result is received by the diagnosis result reception unit 55 of the server 1 from the communication unit 502 via the external terminal 9. The rank giving unit 34 gives the ranks to the secondary battery modules based on the diagnosis results of the degrees of deterioration received by the diagnosis result reception unit 55. In the present embodiment, it may be designed such that the battery diagnosis unit 501 mounted on the vehicle 500 diagnoses the degree of deterioration of the secondary battery module by charging and discharging the battery assembly with the use of a charging and discharging machine provided outside the vehicle while the battery assembly is mounted on the vehicle 500. Note that in the third embodiment, the same configurations as those of the first embodiment will be denoted by the same reference signs, and the description thereof will be omitted.

As described above, the server 1 according to the third embodiment includes the diagnosis result reception unit 55 capable of receiving the diagnosis results of the degrees of deterioration of the secondary battery modules, and the rank giving unit 34 that gives the ranks to the secondary battery modules based on the diagnosis results of the degrees of deterioration received by the diagnosis result reception unit 55. As a result, the rank can be given by using the degree of deterioration of the secondary battery module acquired outside the server 1, so that the server 1 does not need to include the battery diagnosis unit 33, and the configuration of the server 1 can be simplified.

In the server 1 according to the third embodiment, the diagnosis result reception unit 55 is configured to receive a diagnosis result of the degree of deterioration of the secondary battery module diagnosed by the battery diagnosis unit 501 mounted on the vehicle 500 while the battery assembly including the secondary battery module is mounted on the vehicle. As a result, a configuration, suitable for reuse of the secondary battery module constituting the battery assembly mounted on the vehicle 500, can be achieved.

Fourth Embodiment

Figure 9:
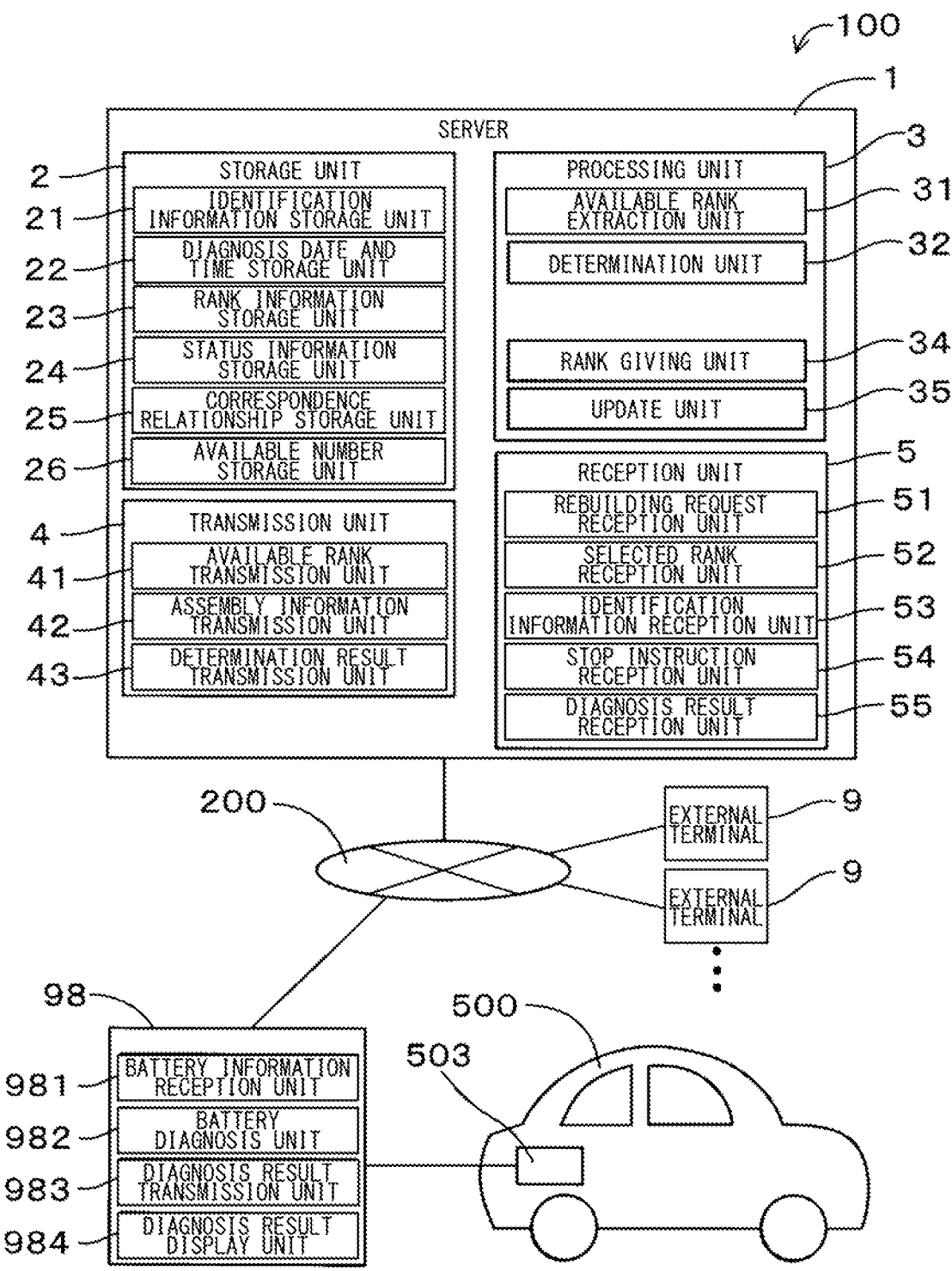
FIG. 9 is a conceptual view illustrating a configuration of a used secondary battery module management system in a fourth embodiment.

In a fourth embodiment illustrated in FIG. 9, a scan tool 98, which is an external device different from the external terminal 9 of the first embodiment described above, is used. In the fourth embodiment, the server 1 includes the diagnosis result reception unit 55 without having the battery diagnosis unit 33, as illustrated in FIG. 9 and similarly to the server 1 of the third embodiment. The scan tool 98 includes a battery information reception unit 981, a battery diagnosis unit 982, a diagnosis result transmission unit 983, and a diagnosis result display unit 984. Note that the scan tool 98 may include an operation unit that a user uses to operate the scan tool 98. The vehicle 500 has a communication unit 503 capable of communicating with the scan tool 98. The battery information reception unit 981 of the scan tool 98 is connected to the communication unit 503 of the vehicle in a wired or wireless manner. The diagnosis result transmission unit 983 of the scan tool 98 is connected to the server 1 in a wired or wireless manner via the communication network 200.

In the fourth embodiment, battery information, obtained by charging and discharging a battery assembly mounted on the vehicle 500 with the use of a device mounted on the vehicle 500, is transmitted to the scan tool 98 by the communication unit 503. The battery information reception unit 981 of the scan tool 98 receives the battery information. The battery diagnosis unit 982 included in the scan tool 98 diagnoses the degree of deterioration of the secondary battery modules constituting the battery assembly. Then, the diagnosis result transmission unit 983 transmits the diagnosis result to the server 1. The diagnosis result may be displayed on the diagnosis result display unit 984 included in the scan tool 98 so that a user can confirm it. Alternatively, it may be designed such that the battery diagnosis unit 982 included in the scan tool 98 diagnoses the degree of deterioration of the secondary battery module by charging and discharging the battery assembly with the use of a charging and discharging machine provided outside the vehicle while the battery assembly is mounted on the vehicle 500.

In the server 1 according to the fourth embodiment, it is possible to diagnose the degree of deterioration of the secondary battery module and to transmit the diagnosis result to the server 1 while the battery assembly is mounted on the vehicle 500. As a result, a configuration, suitable for reuse of the secondary battery module constituting the battery assembly mounted on the vehicle 500, can be achieved.

Fifth Embodiment

Figure 10:
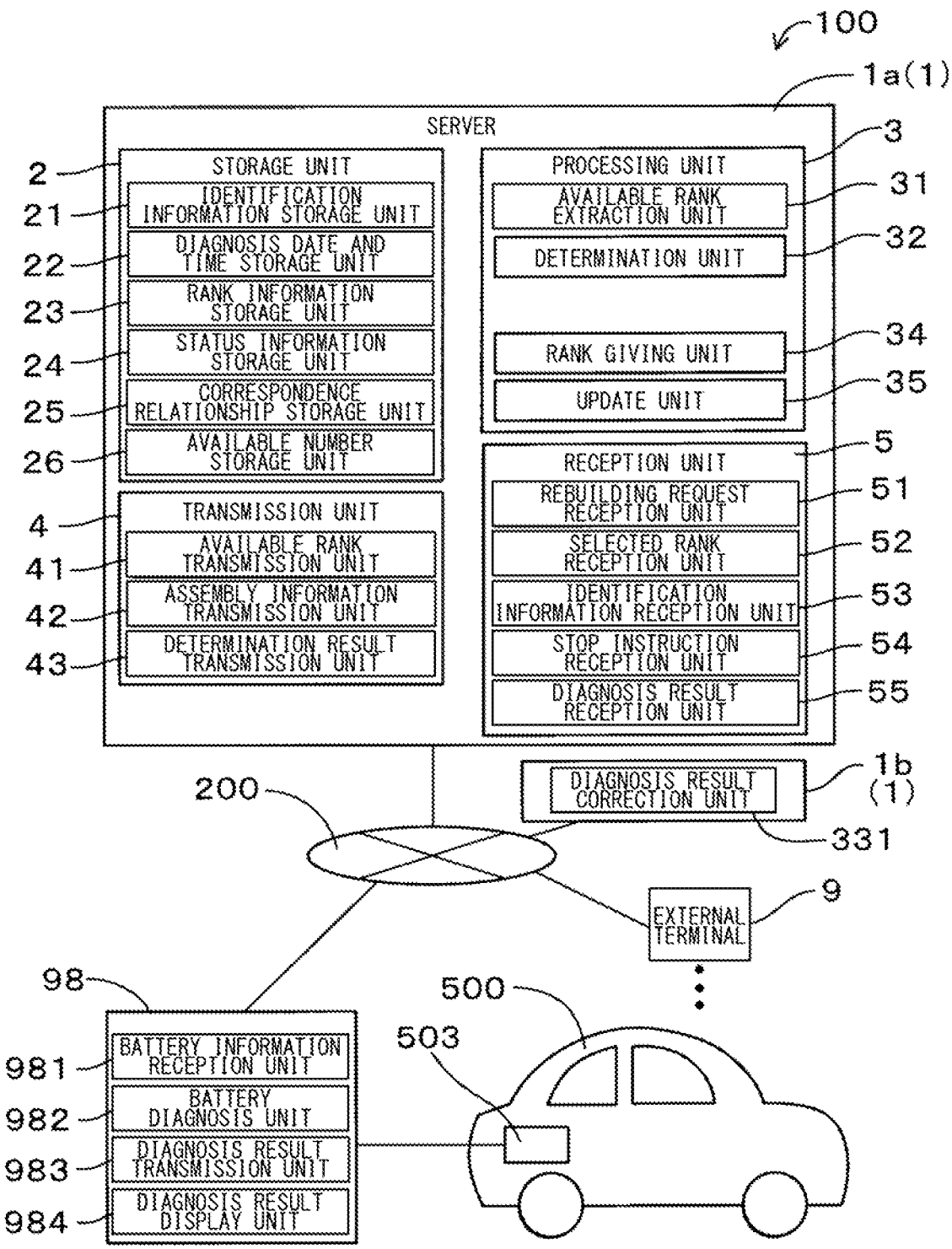
FIG. 10 is a conceptual view illustrating a configuration of a used secondary battery module management system in a fifth embodiment.

In a fifth embodiment illustrated in FIG. 10, the server 1 includes a diagnosis result correction unit 331 that corrects a diagnosis result based on temperature information when the diagnosis result of the secondary battery module is created. The rank giving unit 34 is configured to give a rank to the secondary battery module based on the corrected diagnosis result. In the fifth embodiment, the server 1 includes a server 1a having a configuration similar to that of the server 1 of the fourth embodiment illustrated in FIG. 9, and a server 1b having the diagnosis result correction unit 331. The server 1a and the server 1b are installed in places different from each other, and both are connected via the communication network 200.

In the fifth embodiment, the battery diagnosis unit 982 included in the scan tool 98 illustrated in FIG. 10 diagnoses the degree of deterioration of the secondary battery module constituting the battery assembly provided in the vehicle 500, and creates a diagnosis result, similarly to the fourth embodiment illustrated in FIG. 9. The diagnosis result includes temperature information when the diagnosis result is created. Then, the diagnosis result transmission unit 983 included in the scan tool 98 transmits the diagnosis result to the server 1b. In the server 1b that has received the diagnosis result, the diagnosis result correction unit 331 corrects the diagnosis result based on the temperature information included in the diagnosis result. The correction of the diagnosis result can be performed such that, for example, when the temperature information is compared with a preset reference temperature and when the temperature information is different from the reference temperature, the diagnosis result is corrected by a predetermined method so as to be equal to that diagnosed at the reference temperature. Thereafter, the corrected diagnosis result is transmitted to the server 1a via a transmission unit (not illustrated) included in the server 1b. In the server 1a, the rank giving unit 34 gives a rank to the secondary battery module based on the corrected diagnosis result. Other configurations and processing are similar to those in the fourth embodiment.

In the fifth embodiment, the ranks are given by the diagnosis results corrected based on the temperature information when the diagnosis results are created. Therefore, an influence on the diagnosis result due to a difference in the temperature environment in which the diagnosis is performed can be eliminated, so that accuracy in giving the rank can be enhanced. Furthermore, the place where the diagnosis of a battery is performed and the place where the disassembly, storage, repair, or assembly of a battery is performed can be made different from each other. As a result, efficient and quick repair services can be provided to customers. For example, a customer can get the diagnosis performed in a nearby vehicle dealer or the like, so that travel time can be reduced. Also, a battery diagnosis result is found at the vehicle dealer or the like, so that repair cost can be known on the spot. In addition, staffing and equipment ownership can be performed efficiently by concentrating repair locations.

In the fifth embodiment, the battery diagnosis unit 982 is included in the scan tool 98 provided in a vehicle dealer or the like different from the place where the server 1a is installed, and the server 1b is also installed in a location different from the server 1a. However, the present embodiment is not limited thereto, and the server 1a may include one or both of the battery diagnosis unit and the diagnosis result correction unit.

Sixth Embodiment

Figure 11:
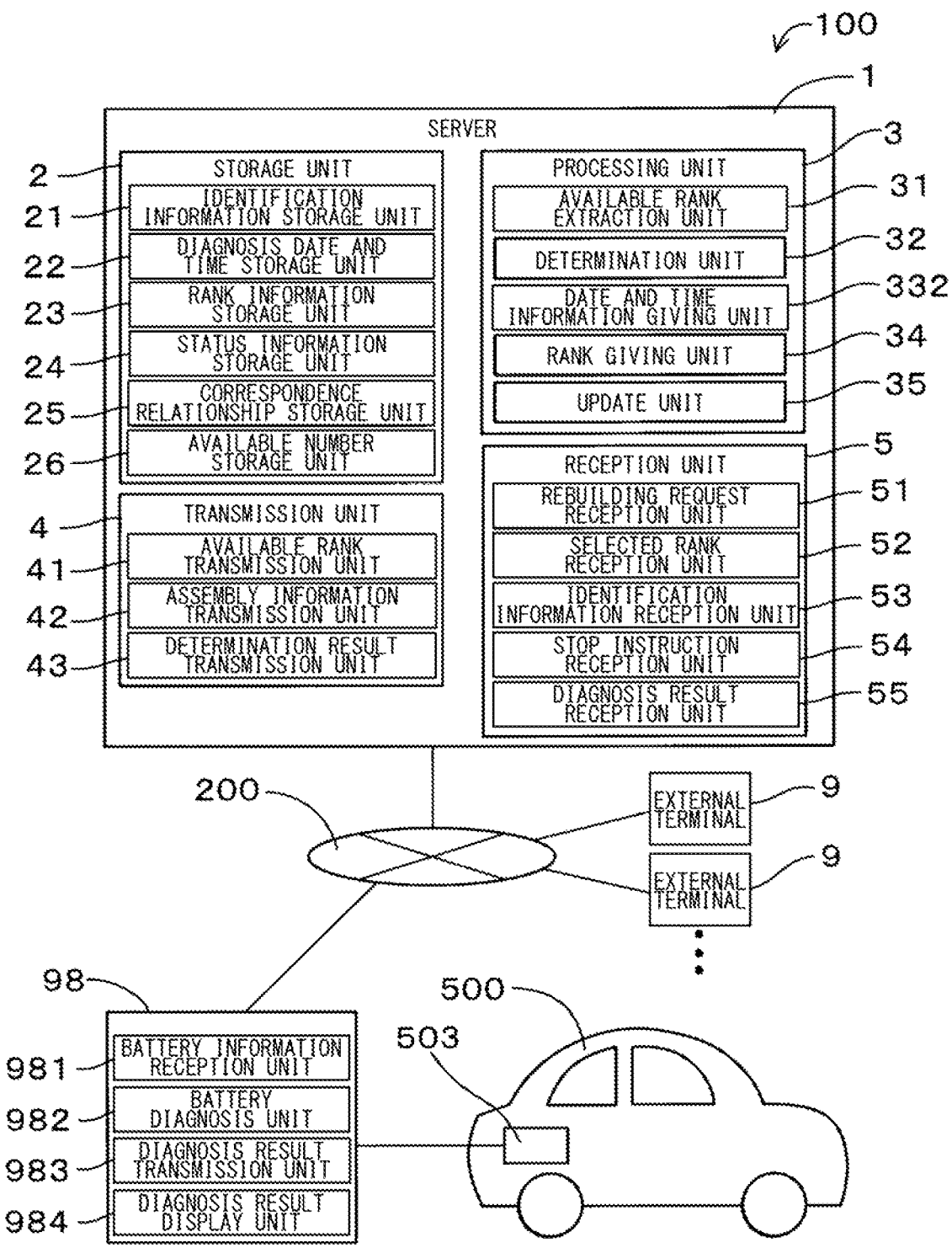
FIG. 11 is a conceptual view illustrating a configuration of a used secondary battery module management system in a sixth embodiment.

In a sixth embodiment illustrated in FIG. 11, the server 1 has a configuration similar to that of the above-described fourth embodiment, and further includes a date and time information giving unit 332 that gives diagnosis date information included in a diagnosis result to the secondary battery module. In the sixth embodiment, the scan tool 98 is provided in a vehicle dealer or the like, and the date and time when the battery diagnosis unit 982 provided in the scan tool 98 creates a diagnosis result is included in the diagnosis result as date and time information.

In the sixth embodiment, the date and time when a diagnosis result of the degree of deterioration of the secondary battery module is created is given to the secondary battery module as the date and time information, so that misassembly can be further prevented by referring to the date and time information when the secondary battery module is assembled according to the assembly information. Furthermore, the place where diagnosis of a battery is performed and the place where disassembly, storage, repair, or assembly of a battery is performed can be made different from each other, as in the case of the fifth embodiment. As a result, efficient and quick repair services can be provided to customers, and staffing and equipment ownership can also be performed efficiently by concentrating repair locations.

Note that, in the present embodiment, the date and time information giving unit 332 is included in the server 1. Alternatively, however, the date and time information giving unit 332 may be includes in the scan tool 98 provided in a vehicle dealer or the like existing in a place different from the server 1.

What is claimed is:

1. A used secondary battery module management system server configured to manage a manufacture of a battery assembly, the used secondary battery module management system server comprising:
   a storage unit configured to (i) store identification information on each of secondary battery modules used, rank information on ranks of the secondary battery modules based on a degree of deterioration of each of the secondary battery modules, and status information on a usage state of each of the secondary battery modules, and (ii) store a correspondence relationship of each of the secondary battery modules among the identification information, the rank information, and the status information;
   an available rank extraction unit configured to extract an available rank from the ranks in response to a rebuilding request for the battery assembly, the available rank being a rank in which a number of the secondary battery modules having the status information indicating that the secondary battery modules are available is equal to or larger than a number of the secondary battery modules required to constitute the battery assembly;
   an available rank transmission unit configured to transmit the available rank to an external terminal;
   an identification information reception unit configured to receive, from the external terminal, the identification information on each of selection secondary battery modules having an identical rank, the selection secondary battery modules being selected from the secondary battery modules to which the ranks have been given based on the available rank;

a determination unit configured to determine, based on the correspondence relationship stored in the storage unit, whether the identification information received by the identification information reception unit matches with the identification information on the secondary battery modules to which the identical rank included in the available rank has been given; and a determination result transmission unit configured to transmit, to the external terminal, a determination result in the determination unit.

2. The used secondary battery module management system server according to claim 1, wherein
the determination unit further determines whether a diagnosis date and time of the degree of deterioration of each of the selection secondary battery modules selected based on the available rank is within a predetermined period.

3. The used secondary battery module management system server according to claim 1, wherein
the determination unit further determines (i) whether the selection secondary battery modules selected based on the available rank include a secondary battery module with an oldest diagnosis date and time of the degree of deterioration in the rank to which the selection secondary battery modules belong, or (ii) whether the selection secondary battery modules selected based on the available rank are sequentially selected in chronological order of a diagnosis date and time of the degree of deterioration in the rank to which the selection secondary battery modules belong.

4. The used secondary battery module management system server according to claim 1, wherein
the available rank extraction unit preferentially extracts a rank with an older specific diagnosis date and time, and
the specific diagnosis date and time is an oldest diagnosis date and time among diagnosis date and time of the degree of deterioration of each of the secondary battery modules included in each rank.

5. The used secondary battery module management system server according to claim 1, further comprising:
a selected rank reception unit configured to receive a selected rank selected from the available rank; and
an assembly information transmission unit configured to transmit, to the external terminal, assembly information on secondary battery modules that belong to the selected rank.

6. The used secondary battery module management system server according to claim 5, further comprising
an update unit configured to update the information stored in the storage unit, wherein
the storage unit stores, as an available number of the secondary battery modules for each rank, a number of the secondary battery modules included in each rank and having the status information indicating that the secondary battery modules are available;
the available rank extraction unit extracts the available rank based on the available number stored in the storage unit; and
when receiving the selected rank from the external terminal, the update unit updates the available number of the secondary battery modules in the selected rank to a number obtained by subtracting the number of the secondary battery modules required to constitute the battery assembly from the available number.

7. The used secondary battery module management system server according to claim 6, wherein
when the determination result in the determination unit is affirmative, the update unit updates the status information on each of the selection secondary battery modules to an assembled state, and
when it is determined that the rebuilding is to be stopped, the update unit updates the available number of the secondary battery modules stored in the storage unit by returning to a state before updating, and updates the status information on each of the selection secondary battery modules to an available state.

8. The used secondary battery module management system server according to claim 1, further comprising:
a battery diagnosis unit configured to diagnose the degree of deterioration of each of the secondary battery modules; and
a rank giving unit configured to give a rank to each of the secondary battery modules based on a diagnosis result in the battery diagnosis unit.

9. The used secondary battery module management system server according to claim 8, wherein
the battery diagnosis unit diagnoses the degree of deterioration of each of the secondary battery modules based on a battery characteristic related to a transition of a battery state in a predetermined voltage range of each of the secondary battery modules.

10. The used secondary battery module management system server according to claim 1, further comprising:
a diagnosis result reception unit configured to receive a diagnosis result of the degree of deterioration of each of the secondary battery modules; and
a rank giving unit configured to give a rank to each of the secondary battery modules based on the diagnosis result.

11. The used secondary battery module management system server according to claim 10, wherein
when the battery assembly including the secondary battery modules is mounted on a vehicle, a diagnostic device mounted on the vehicle diagnoses the degree of deterioration of each of the secondary battery modules included in the battery assembly and the diagnosis result reception unit receives the diagnosis result from the diagnostic device.

12. The used secondary battery module management system server according to claim 8, further comprising
a diagnosis result correction unit configured to correct the diagnosis result based on temperature information when the diagnosis result is created, wherein
the rank giving unit gives the rank to each of the secondary battery modules based on the diagnosis result corrected.

13. The used secondary battery module management system server according to claim 8, further comprising
a date and time information giving unit configured to give diagnosis date information to each of the secondary battery modules based on the diagnosis result, wherein
the diagnosis result includes the diagnosis date information related to date and time when the diagnosis result is created.

14. The used secondary battery module management system server according to claim 1, wherein
the identification information is given when the secondary battery module is manufactured.

15. A used secondary battery module management system external terminal configured to manage a manufacture of a battery assembly, the used secondary battery module management system external terminal comprising:
- an available rank reception unit configured to receive an available rank from a server, the available rank being a rank included in ranks defined based on degrees of deterioration of secondary battery modules, a number of secondary battery modules that belongs to the available rank being equal to or larger than a number of secondary battery modules required to constitute a battery assembly required to be rebuilt,
- an available rank display unit configured to display the available rank received by the available rank reception unit;
- an identification information acquisition unit configured to acquire identification information on each of secondary battery modules selected, based on the available rank displayed on the available rank display unit, from the secondary battery modules to which the ranks are given in advance;
- an identification information transmission unit configured to transmits, to the server, the identification information acquired by the identification information acquisition unit;
- a determination result reception unit configured to receive a determination result as to whether the identification information that has been transmitted matches with identification information on the secondary battery modules belonging to an identical rank in the available rank; and
- a determination result output unit configured to output the determination result received by the determination result reception unit.

16. The used secondary battery module management system external terminal according to claim 15, wherein
the available rank display unit preferentially displays a rank with an older specific diagnosis date and time, and
the specific diagnosis date and time is an oldest diagnosis date and time among diagnosis date and time of the degree of deterioration of each of the secondary battery modules included in each rank.

17. The used secondary battery module management system external terminal according to claim 15, further comprising:
- a selected rank transmission unit configured to transmit, to the server, a selected rank selected from the available rank displayed on the available rank display unit;
- an assembly information reception unit configured to receive, from the server, assembly information on the secondary battery modules belonging to the selected rank; and
- an assembly information output unit configured to output the assembly information received by the assembly information reception unit.

18. The used secondary battery module management system external terminal according to claim 15, wherein
the identification information acquisition unit acquires, as the identification information on the secondary battery modules, identification information given when the secondary battery module is manufactured.

19. A used secondary battery module management system comprising:
- the used secondary battery module management system server according to claim 1; and
- a used secondary battery module management system external terminal configured to manage the manufacture of the battery assembly, wherein
the used secondary battery module management system external terminal includes:
- an available rank reception unit configured to receive the available rank from the server, the available rank being a rank included in ranks defined based on degrees of deterioration of secondary battery modules, a number of secondary battery modules that belongs to the available rank being equal to or larger than a number of secondary battery modules required to constitute a battery assembly required to be rebuilt,
- an available rank display unit configured to display the available rank received by the available rank reception unit;
- an identification information acquisition unit configured to acquire the identification information on each of secondary battery modules selected, based on the available rank displayed on the available rank display unit, from the secondary battery modules to which the ranks are given in advance;
- an identification information transmission unit configured to transmits, to the server, the identification information acquired by the identification information acquisition unit;
- a determination result reception unit configured to receive a determination result as to whether the identification information that has been transmitted matches with identification information on the secondary battery modules belonging to an identical rank in the available rank; and
- a determination result output unit configured to output the determination result received by the determination result reception unit.

* * * * *